(12) United States Patent
Lung et al.

(10) Patent No.: US 9,336,867 B2
(45) Date of Patent: May 10, 2016

(54) PHASE CHANGE MEMORY CODING

(71) Applicant: MACRONIX INTERNATIONAL CO., LTD., Hsinchu (TW)

(72) Inventors: Hsiang-Lan Lung, Ardsley, NY (US); Ming-Hsiu Lee, Hsinhu (TW); Yen-Hao Shih, Elmsford, NY (US); Tien-Yen Wang, Taipei (TW); Chao-I Wu, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 39 days.

(21) Appl. No.: 14/148,545

(22) Filed: Jan. 6, 2014

(65) Prior Publication Data
US 2014/0119110 A1    May 1, 2014

Related U.S. Application Data

(62) Division of application No. 12/823,508, filed on Jun. 25, 2010, now Pat. No. 8,634,235.

(51) Int. Cl.
    *G11C 11/00*     (2006.01)
    *G11C 13/00*     (2006.01)
    *G11C 11/56*     (2006.01)

(52) U.S. Cl.
    CPC ........ *G11C 13/0004* (2013.01); *G11C 11/5678* (2013.01); *G11C 13/004* (2013.01); *G11C 13/0069* (2013.01); *G11C 2013/0092* (2013.01)

(58) Field of Classification Search
    None
    See application file for complete search history.

(56) References Cited

U.S. PATENT DOCUMENTS

| | | | |
|---|---|---|---|
| 3,922,648 | A | 11/1975 | Buckley |
| 4,225,946 | A | 9/1980 | Neale et al. |
| 4,228,524 | A | 10/1980 | Neale et al. |
| 5,341,328 | A | 8/1994 | Ovshinsky et al. |
| 6,762,952 | B2 | 7/2004 | Munden et al. |
| 6,768,665 | B2 | 7/2004 | Parkinson et al. |

(Continued)

FOREIGN PATENT DOCUMENTS

| | | |
|---|---|---|
| JP | 2008176906 A | 7/2008 |
| JP | 2009123847 A | 6/2009 |

OTHER PUBLICATIONS

Breitwisch et al. "Novel Lithography-Independent Pore Phase Change Memory," Symposium on VLSI Technology Digest of Technical Papers, Jun. 2007, 2 pages.

(Continued)

*Primary Examiner* — Kretelia Graham
(74) *Attorney, Agent, or Firm* — Haynes Beffel & Wolfeld LLP

(57) ABSTRACT

An integrated circuit phase change memory can be pre-coded by inducing a first resistance state in some cells and the memory, and a second resistance state and some other cells in the memory to represent a data set. The integrated circuit phase change memory is mounted on a substrate after coding the data set. After mounting the integrated circuit phase change memory, the data set is read by sensing the first and second resistance states, and changing cells in the first resistance state to a third resistance state and changing cells in the second resistance state to a fourth resistance state. The first and second resistance states maintain a sensing margin after solder bonding or other thermal cycling process. The third and fourth resistance states are characterized by the ability to cause a transition using higher speed and lower power, suitable for a mission function of a circuit.

9 Claims, 22 Drawing Sheets

(56) References Cited

U.S. PATENT DOCUMENTS

| | | | |
|---|---|---|---|
| 6,781,906 B2 | 8/2004 | Perner et al. | |
| 6,927,411 B2 | 8/2005 | Kozicki | |
| 7,075,841 B2 * | 7/2006 | Resta et al. | 365/189.16 |
| 7,085,154 B2 | 8/2006 | Cho et al. | |
| 7,190,607 B2 | 3/2007 | Cho et al. | |
| 7,289,351 B1 | 10/2007 | Chen et al. | |
| 7,365,355 B2 | 4/2008 | Parkinson | |
| 7,505,330 B2 | 3/2009 | Pawlowski et al. | |
| 7,539,050 B2 | 5/2009 | Philipp et al. | |
| 7,558,105 B2 | 7/2009 | Suh | |
| 7,564,710 B2 | 7/2009 | Happ et al. | |
| 7,571,901 B2 | 8/2009 | Philipp | |
| 7,577,024 B2 | 8/2009 | Fackenthal et al. | |
| 7,580,277 B2 * | 8/2009 | Fuji | G11C 11/406 365/148 |
| 7,619,936 B2 | 11/2009 | Philipp et al. | |
| 7,656,701 B2 | 2/2010 | Lee et al. | |
| 7,679,954 B2 | 3/2010 | Lee et al. | |
| 7,751,227 B2 | 7/2010 | Fuji | |
| 7,764,533 B2 | 7/2010 | Breitwisch et al. | |
| 7,767,993 B2 | 8/2010 | Toda et al. | |
| 7,781,753 B2 | 8/2010 | Hosaka et al. | |
| 7,796,424 B2 | 9/2010 | Happ et al. | |
| 7,826,248 B2 | 11/2010 | Xi et al. | |
| 7,830,701 B2 | 11/2010 | Siau et al. | |
| 7,863,594 B2 | 1/2011 | Akinaga et al. | |
| 7,867,804 B2 | 1/2011 | Lee | |
| 8,149,608 B2 | 4/2012 | Lee | |
| 8,634,235 B2 | 1/2014 | Lung et al. | |
| 2003/0002331 A1 | 1/2003 | Park et al. | |
| 2005/0275433 A1 | 12/2005 | Lee | |
| 2006/0034112 A1 | 2/2006 | Oh et al. | |
| 2006/0077741 A1 | 4/2006 | Wang et al. | |
| 2006/0151849 A1 | 7/2006 | Czubatyj | |
| 2007/0140029 A1 | 6/2007 | Kim et al. | |
| 2007/0201267 A1 * | 8/2007 | Happ et al. | 365/163 |
| 2007/0255891 A1 | 11/2007 | Chow et al. | |
| 2008/0019170 A1 | 1/2008 | Happ et al. | |
| 2008/0048167 A1 | 2/2008 | Kostylev et al. | |
| 2008/0080228 A1 * | 4/2008 | Nirschl et al. | 365/148 |
| 2008/0105861 A1 | 5/2008 | Hosaka et al. | |
| 2008/0266932 A1 | 10/2008 | Happ et al. | |
| 2009/0008636 A1 | 1/2009 | Lee | |
| 2009/0067229 A1 * | 3/2009 | Kang | G11C 8/06 365/163 |
| 2009/0213644 A1 | 8/2009 | Parkinson | |
| 2009/0237985 A1 | 9/2009 | Matsuzaki et al. | |
| 2009/0250678 A1 | 10/2009 | Osano et al. | |
| 2009/0273968 A1 | 11/2009 | Lamorey et al. | |
| 2010/0012913 A1 | 1/2010 | Lee | |
| 2010/0038614 A1 | 2/2010 | Hampton | |
| 2010/0084624 A1 | 4/2010 | Lung et al. | |
| 2010/0214829 A1 | 8/2010 | Breitwisch et al. | |
| 2010/0214830 A1 * | 8/2010 | Franceschini et al. | 365/163 |
| 2010/0220520 A1 | 9/2010 | Hwang et al. | |
| 2010/0314601 A1 | 12/2010 | Lee | |
| 2010/0328995 A1 | 12/2010 | Shih et al. | |
| 2010/0328996 A1 | 12/2010 | Shih et al. | |
| 2011/0013446 A1 | 1/2011 | Lung | |
| 2011/0116309 A1 | 5/2011 | Lung | |

OTHER PUBLICATIONS

European Office Action from related Application EP 10 190 791.3 dated Jan. 8, 2014, 7 pages.

Extended EP Search Report and Opinion mailed Mar. 21, 2011 for EP 10 19 0791, 7 pp.

IPC/JEDEC Joint Industry Standard (IPC/JEDEC J-STD-020D.1) "Moisture/Reflow Sensitivity Classification for Nonhermetic Solid State Surface Mount Devices," Mar. 2008, 22 pages.

Lai et al., "OUM—A 180 nm Nonvolatile Memory Cell Element Technology for Stand Alone and Embedded Applications," IEEE IEDM Technical Digest,pp. 803-806, Dec. 2001.

Shih et al. "Understanding amorphous states of phase-change memory using Frenkel-Poole model," IEEE IEDM Electron Dec. 2009, 4 pages.

Villa et al., "A 45nm 1Gb 1.8V phase-change memory," Solid-State Circuits Conference Digest of Technical Papers (ISSCC), 14.8, Feb. 2010, pp. 270-271.

* cited by examiner

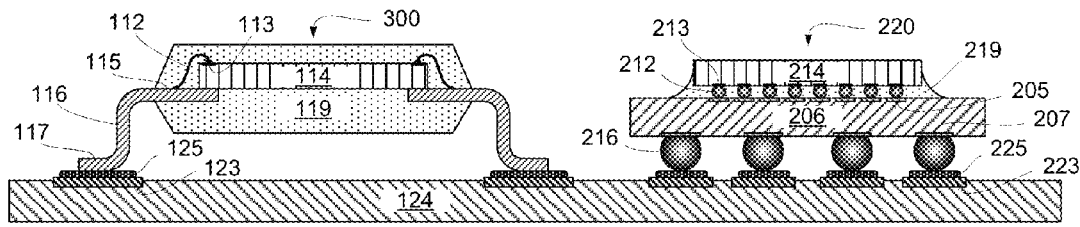
FIG. 2A – PRIOR ART
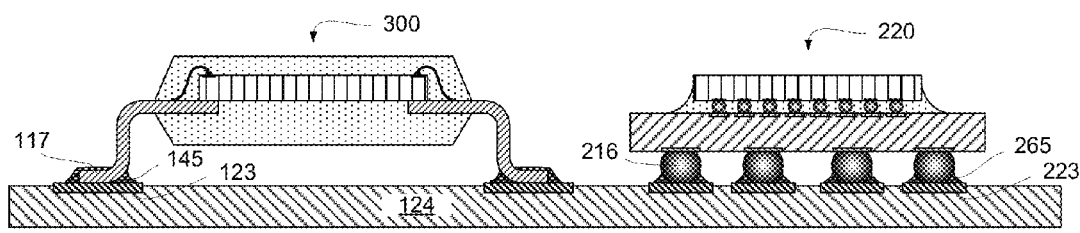
FIG. 2B– PRIOR ART
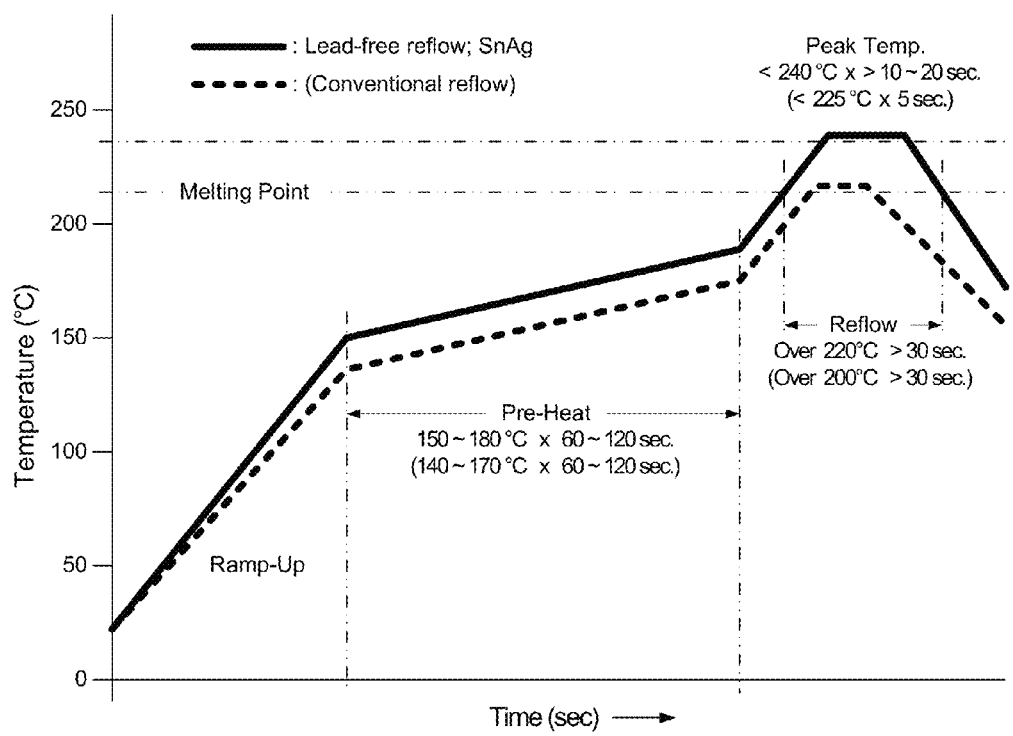
FIG. 3– PRIOR ART

PHASE CHANGE MEMORY CODING

RELATED APPLICATIONS

This application is a divisional of U.S. patent application Ser. No. 12/823,508 filed on 25 Jun. 2010, and issued as U.S. Pat. No. 8,634,235 on 21 Jan. 2014, which application is incorporated by reference.

PARTIES TO A RESEARCH AGREEMENT

International Business Machines Corporation, a New York corporation and Macronix International Corporation, Ltd., a Taiwan corporation, are parties to a Joint Research Agreement.

BACKGROUND

This invention relates to phase change memory devices.

Phase change based memory materials, such as chalcogenide-based materials and similar materials, can be caused to change phase between an amorphous phase and a crystalline phase by application of electrical current at levels suitable for implementation in integrated circuits. The generally amorphous phase is characterized by higher electrical resistivity than the generally crystalline phase, which can be readily sensed to indicate data. These properties have generated interest in using programmable resistive material to form nonvolatile memory circuits, which can be read and written with random access.

The change from the amorphous phase to the crystalline phase, referred to as set herein, is generally a lower current operation. Generally, a current pulse for a set operation has a magnitude that is not sufficient to melt the active region of a cell, but heats the active region to a transition temperature at which amorphous phase change material tends to change to a crystalline solid phase. The change from crystalline phase to amorphous phase, referred to as reset herein, is generally a higher current operation, which includes a short high current density pulse to melt or breakdown the crystalline structure. The reset pulse generally has a short duration and quick fall time, so that the phase change material cools quickly, quenching the phase change process and allowing at least a portion of the phase change material to stabilize in an amorphous solid phase. The magnitude of the current needed for reset can be reduced by reducing the size of the phase change material element in the cell and/or the contact area between electrodes and the phase change material, such that higher current densities are achieved with small absolute current values through the phase change material element.

One limitation on applications of phase change memory arises from the fact that phase transitions are caused by heat. Thus, heat in an environment in which the chip is deployed can cause loss of data, and loss of reliability.

Also, this limitation to use in environments that do not expose the chips to heat creates another limitation on applications of the technology. Specifically, the chip may be mounted onto and electrically connected to circuitry in a substrate (such as a package substrate, or a printed circuit board, for example), in a surface mount operation or other mounting process that involves a thermal cycle. For example, the surface mount operation typically includes a solder reflow procedure, requiring that the assembly (including the chip) be heated to bring the solder to a temperature about the melting point (or the eutectic point) of the alloy constituting the solder. Other mounting procedures also involve thermal cycles subjecting the chip to high temperatures. This may result in a change in the resistance of the material in these cells, so that the cell is no longer read as programmed.

For this reason, prior art phase change memory chips have not been available that are capable of retaining a data set stored before the mounting process. So, board manufacturers are required to store any necessary code on the chip, after assembly of the circuit board or after assembly of a system including the circuit board. This makes phase change memory devices less desirable than other types of non-volatile memory for many uses.

It is desirable to provide a phase change memory chip that can be used in extreme operating environments. It is desirable to provide a phase change memory chip that can be coded prior to mounting on a circuit board, using a process that retains the data during thermal cycles encountered during board or assembly manufacturing.

SUMMARY

A phase change memory device described herein can hold data through thermal events, such as a mounting process involving soldering, and in high temperature environments.

An integrated circuit comprises an array of single bit, phase change memory cells, including a data set stored therein represented by some memory cells in the array having a first resistance state and by other memory cells in the array having a second resistance state. The first resistance state corresponds to a crystalline phase active region having a first temperature-hardened morphology, and the second resistance state having a minimum resistance provided by crystalline phase active region having a second morphology. As the term is used herein, morphology refers to the structure and stoichiometry of the memory material, which can change locally in response to applied energy at an active region of a memory element. Thus, the first temperature-hardened morphology and the second morphology differ by one or more of grain size, stoichiometry of the phase change material, concentration of additives, segregation of additives, or other characteristics that contribute to changes in resistance of the active region. The first temperature-hardened morphology is characterized by being induced by higher energy current pulses than the second morphology, being a crystalline phase and by holding a lower resistance than the second morphology under thermal stress that can cause phase transition from the amorphous phase to a crystalline phase in the phase change material of the cell. Also, the temperature-hardened morphology can have a structure that does not fall in resistance, and does not increase in resistance by more than a predetermined amount, in response to thermal events. The second morphology is characterized by being induced at lower energy, being a crystalline phase and maintaining a higher resistance than the first morphology under thermal stress that would cause phase transition from an amorphous phase to a crystalline phase in the phase change material of the cell.

The first morphology can be induced using a set pulse having relatively long duration and slow fall time, with a magnitude and duration to deliver an energy sufficient to cause the morphology change. The second morphology can be induced using a typical set pulse with a fall time allowing crystalline phase formation, while having an energy insufficient to cause the lower, first resistance state.

A method for operating a phase change memory is described based on inducing a lower resistance state in some cells in the memory, and a higher resistance state in some other cells in the memory, where the lower resistance state corresponds with the first morphology and the higher resistance state corresponds with the second morphology.

A method for manufacturing a circuit including an integrated circuit phase change memory with pre-coding is described, based on coding a data set in the integrated circuit phase change memory by inducing a lower resistance state in some cells and the memory, and a higher resistance state in some other cells in the memory. The process involves mounting the integrated circuit phase change memory on a substrate after coding the data set. After mounting the integrated circuit phase change memory, the process involves reading the data set by sensing first and second resistance states, which correspond to the lower and higher resistance states after the thermal event of mounting the integrated circuit.

A process can be executed if desired for a particular application, to change cells in the first resistance state to a third resistance state and to change cells in the second resistance state to a fourth resistance state. The first and second resistance states maintain a sensing margin even after a mounting process that involves solder bonding or other thermal cycling process. The third and fourth resistance states are characterized by the ability to cause a transition using higher speed and lower power, suitable for a mission function of a circuit including the integrated circuit phase change memory. In support of this process, an integrated circuit is described that includes an array of phase change memory cells with sensing circuits operable in first and second modes. The first mode is used for sensing data values in the array in response to the first and second resistance states used for pre-coding. The second mode is used for sensing data values in the array in response to the third and fourth resistance states which are used during operation of the device. Control circuits and biasing circuits are coupled to the array, and arranged to execute transition processes for changing from the pre-coded resistance states to the operational mode resistance states. Processes include reading a data set with the sensing circuits in the first mode by sensing the first and second resistance states, changing cells in the first resistance state to a third resistance state and changing cells in the second resistance state to a fourth resistance state so that thereafter, the data set is readable with the sensing circuits in the second mode. Also, processes executed under control of the control circuits and biasing circuits include write processes to write data in the array by inducing the third and fourth resistance states in addressed cells, and read processes to read data in the array with the sensing circuits in the second mode. Prior to the transition processes, the integrated circuit can include a pre-coded data set represented by some memory cells in the array having the first resistance state, and by other memory cells in the array having a second resistance state.

Phase change materials as formed for use in an integrated circuit phase change memory have a basis stoichiometry. A process for inducing a lower resistance state in a memory cell as described herein includes applying a current pulse to cause a change in the stoichiometry in the active region of the cell, to a combination having a lower crystalline phase resistance than the crystalline phase resistance of the basis material. A pulse used to induce the lower resistance state can have a magnitude below the threshold for causing melting of the active region, with a duration long enough to allow stoichiometric changes in the active region. For example, where the basis phase change material comprises a dielectric-doped $Ge_xSb_yTe_z$, such as for example $Ge_2Sb_2Te_5$, a lower resistance state can be induced by applying a current pulse cause a change in stoichiometry in the active region to a combination having an increased concentration of antimony Sb. It is found that the lower resistance state can have a lower resistance than the resistance of a similar cell having a stoichiometry closer to the basis stoichiometry, such as encountered by a cell which had not undergone the process of inducing the change. The term "stoichiometry" as used here refers to the quantitative relationship in atomic concentration between two or more substances in the phase change material in a volume measurable, for example, using energy dispersive x-ray spectroscopy (EDX), or equivalent techniques. Also, as explained above, the grain size of the lower resistance state can be larger, also contributing to the lower resistance of the cell.

The higher resistance state used in the pre-coding process can be induced using a typical set pulse have an energy insufficient to cause the lower, first resistance state. The higher resistance state used in the pre-coding process can be induced using a reset pulse having a fall time that prevents transition to a crystalline phase and thereby presents formation of the lower, first resistance state.

The third resistance state, into which cells pre-coded into the first resistance state are changed, can be a higher resistance state induced by applying a pulse to induce an amorphous phase in the active region of the cell. The fourth resistance state into which cells pre-coded into the second resistance state are changed, can be an intermediate resistance state induced by applying a pulse to induce a crystalline phase in the active region of the cell.

The technology described here enables use of phase change memory integrated circuit in systems that rely on non-volatile memory to store configuration data, computer programs and the like, typically implemented using NOR Flash devices, which can be pre-coded. Thus, phase change memory integrated circuits can be "designed in" to systems, without creating requirements for modifications of manufacturing lines to ensure that an embedded system can be programmed after the system is assembled, and without requiring the added expense of implementing such programming processes.

The temperature-hardened morphology described herein can also be used as a one-time programmable fuse for many integrated circuit applications, such as redundancy coding for memory arrays, chip signatures, chip option coding and so on.

The technology described here enables use of phase change memory integrated circuit in systems that are employed in more extreme environments.

Other aspects and advantages of the technology described here are set forth below with reference to the figures, the detailed description and the claims.

BRIEF DESCRIPTION OF THE DRAWINGS

FIGS. 2A and 2B are diagrammatic sketches in sectional view showing stages in a surface mounting procedure.

FIG. 3 is a diagram illustrating a temperature schedule for a surface mounting procedure.

DETAILED DESCRIPTION

The invention will now be described in further detail by reference to the drawings, which illustrate alternative specific embodiments and methods. The drawings are diagrammatic, showing features of the embodiments and their relation to other features and structures, and are not made to scale. For improved clarity of presentation, in the figures illustrating various embodiments, elements corresponding to elements shown in other drawings are not all particularly renumbered, although they are all readily identifiable in all the figures. Also for clarity of presentation certain features are not shown in the figures, where not necessary for an understanding of the invention. It is to be understood that there is no intention to limit the invention to the specifically disclosed embodiments and methods and that the invention may be practiced using other features, elements, methods and embodiments. Particular embodiments are described to illustrate the present invention, not to limit its scope, which is defined by the claims. Those of ordinary skill in the art will recognize a variety of equivalent variations on the description that follows.

Figure 1:
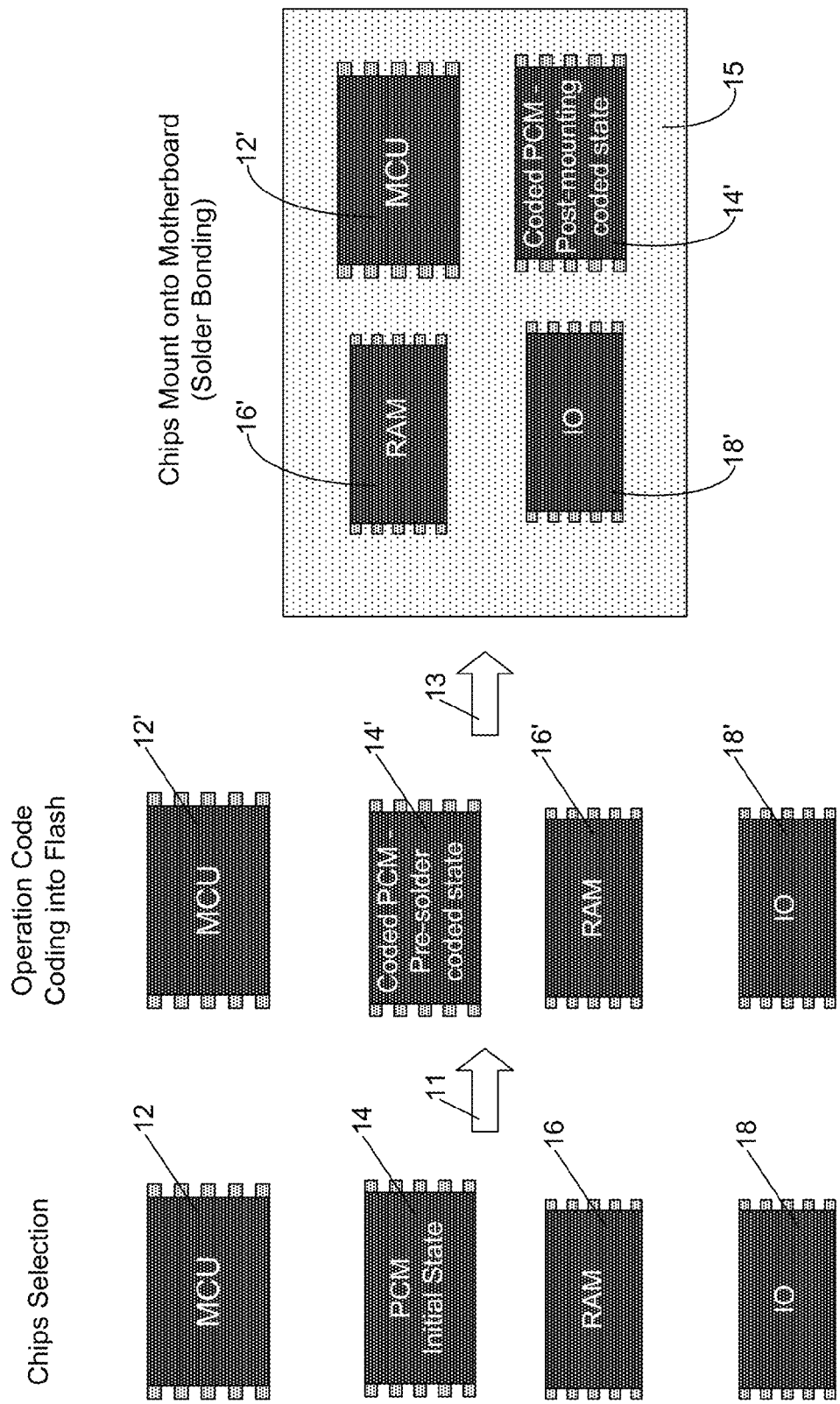
FIG. 1 is a diagram showing stages in assembly of semiconductor chips onto a circuit board.

FIG. 1 diagrammatically illustrates stages in an example of constructing an assembly of semiconductor chips on a circuit board or other substrate. In this example, the desired selection of chips, such as a microcontroller unit MCU 12, a phase change memory PCM 14, at least part of which can be used for storing code or other data sets, random access memory RAM 16, and an input/output I/O device 18 are "designed in" for an electronic product including a circuit board. The non-volatile memory in one or more of the selected chips can be programmed by a manufacturer as indicated by arrow 11, such as using a program and test system before or after packaging of the individual chips. In this example, the PCM 14 is programmed using a pre-mounting coding process to yield coded PCM 14'. Also, any coding in the other chips can also be carried out at this stage, to yield a collection of coded chips 12', 14', 16', 18', adapted for a specific use in the field. The coded chips are thereafter mounted as indicated by arrow 13 onto a circuit board (for example, a motherboard) 15 or other substrate. The procedure used to mount the chips on the substrate can require a thermal cycle that heats the chips, during which the memory cells in the coded PCM can be raised to a temperature above a transition temperature for changes in solid phase of the phase change memory material. Also, in some embodiments known as system-on-a-chip SOC devices, a single chip, including a phase change memory array and other circuitry, can be used in place of the four devices illustrated in FIG. 1.

As discussed in more detail below, the coded PCM in this example is configured to use a first, lower resistance state and a second, higher resistance state to store a data set, where the higher resistance state does not transition to the lower resistance state during the thermal cycle encountered during the mounting process.

Optionally, after the thermal cycle encountered during mounting, the coded PCM can be subjected to a transition process, preferably executed using on-chip control circuits, to change the cells in the first resistance state to a third resistance state, and to change cells in the second resistance state to a fourth resistance state, to form coded PCM 14', in a post-mounting coded state. Transitions between the third and fourth resistance states used to write data in the memory can be induced using set and reset pulses that induce rapid phase change in the active region of the cell suitable for operation of the PCM chip for the mission function of the electronic product. A process is described herein for inducing the first resistance state in the pre-mounting process that includes applying one or more "long set" pulses which lead to establishing a low resistance state in the cells. A process is described herein for inducing the second resistance state in the pre-mounting process that includes applying in the alternative one or more set pulses or one or more reset pulses. Although the mounting process may cause cells programmed to the second resistance state to undergo some disturbance that is reflected by a lowering of the resistance of the cells, the disturbed cells will maintain a resistance well above the low resistance range associated with the first resistance state. For this reason, the data set stored in the PCM chip using the pre-mounting process can be read after mounting. Also, the operating mode of the chip can be changed after mounting, so that data can be read and written using more efficient set and reset processes.

Alternatively, the chip can be configured to operate in a mode in which the cells are maintained in the first and second resistance states, using long set pulses during operation in the field to induce the first, lower resistance state. This can be referred to as a thermally hardened phase change memory chip, operable in more extreme thermal environments, and can operate in a normal environment without being refreshed.

A representative mounting procedure that includes a thermal process that can disturb prior art phase change memory cells is discussed with reference to FIGS. 2A, 2B and 3. Stages in a surface mount operation are illustrated in FIGS. 2A and 2B. In the example shown in these Figs., a leadframe package 300 and a flip-chip package 220 are mounted onto and electrically connected to bond sites 123, 223 exposed at a package mount surface of a circuit board 124.

The leadframe package 300 in this example includes a semiconductor die 114 mounted active side upward on leads 116. Interconnect pads 113 in the die are electrically connected to bond sites on bond fingers 115 on the leads 116 by wire bonds 112. The die, wire bonds, and bond fingers are enclosed in a protective encapsulation 119, constituting a package body from which the leads project. The leads 116 have a dogleg shape, so that the mount feet 117 are situated below the package body, and some clearance is provided between the lower surface of the package body and the upper surface of the circuit board when the feet 117 of the leads are at rest on the bond sites 123.

The flip-chip package 220 in this example includes a die 214 mounted in a flip-chip fashion on, and electrically connected to circuitry on, a package substrate 206. Electrically conductive balls or bumps (typically metal, such as gold or solder) 212 are mounted on interconnect pads 213 on the die. Bond pads 205 connected to circuitry in the substrate 206 are exposed at the die attach surface of the substrate to provide bond sites for attachment of the interconnect balls or bumps. Second-level interconnect lands 207 on the opposite side of the substrate are connected to bond pads 205 by way of the circuitry in the substrate. An underfill 219 fills the space between the active side of the die and the die mount side of the package substrate, to complete the package. Solder balls 216 are mounted on the lands 207 to provide for electrical connection of the package 220 to bond sites 223 on the circuit board.

The second-level interconnection of the leadframe package 300 and the flip-chip package 220 is made by soldering the leadframe feet 117 and the second-level interconnect solder balls 216 onto the bond sites 123, 223. Typically, prior to mounting the packages, the circuit board is prepared by depositing small amounts of solder or solder paste (for example by plating or printing) on the bond sites (the solder or solder paste may optionally be omitted for flip-chip interconnection). Then the packages are oriented so that the feet 117 and the solder balls 216 are aligned with corresponding bond sites 123, 223 on the circuit board, and the packages are moved toward the circuit board so that the feet 117 and solder balls 216 rest on the solder or solder paste 125, 225.

Thereafter the solder or paste (or second-level interconnect solder balls) is heated to reflow the solder and complete the electrical connection. Typically, where solder or solder paste is provided, feet or balls are wetted by the reflowed solder, so that the solder flows over the surfaces of the bond sites 123, 223 and onto the lower surfaces of the feet and the balls, as indicated at 145 and 265 in FIG. 2B.

Heating to reflow the solder or solder paste, typically by passing the assembly through a reflow oven, requires raising the temperature of the assembly according to a time/temperature schedule suitable for the particular solder. FIG. 3 shows examples of reflow heating schedules for a conventional solder (broken line) and for a lead-free SnAg solder. The lead-free solder has a higher melting point and reflows more slowly and, accordingly, the assembly must be brought to a higher temperature and held there for a longer time for the lead-free solder than for the conventional solder. Particularly, for a typical lead-free solder, the temperature is raised during a pre-heat phase from about 150° C. to about 180° C. over a period of about 60 to 120 seconds; and then during a reflow phase lasting over 30 seconds the temperature is raised more rapidly to a peak temperature approaching about 240° C., and is held there for a period of about 10 to 20 seconds or longer and then is allowed to fall; the temperature throughout the reflow phase exceeds about 220° C. And particularly, for a conventional solder, the temperature is raised during a pre-heat phase from about 140° C. to about 170° C. over a period of about 60 to 120 seconds; and then during a reflow phase lasting over 30 seconds the temperature is raised more rapidly to a peak temperature in approaching about 225° C., and is held there for a period of about 5 seconds or longer; the temperature throughout the reflow phase exceeds about 200° C.

As noted in background, above, phase change based memory materials, including chalcogenide based materials and other materials, may be employed in memory cells. One class of chalcogenide based phase change materials contains as principal components Germanium (Ge), Antimony (Sb) and Tellurium (Te) in various combinations, and materials in this class are referred to as GST materials.

Suitable compositions of phase change material have a basis stoichiometry (as deposited) which is substantially uniform $Ge_2Sb_2Te_5$. Other stoichiometries of GST include for example, the compounds $Ge_2Sb_2Te_5$, $Ge_1Sb_2Te_4$, and $Ge_1Sb_4Te_7$, and mixtures of these compounds. More generally, basis phase change materials may include $Ge(x)Sb(2y)Te(x+3y)$, where x and y are integers (including 0). Other basis phase change materials other than GeSbTe-based materials can also be used, including GaSbTe system, which can be described as $Ga(x)Sb(x+2y)Te(3y)$, and x, y are integers. Alternatively, the basis phase change material can be selected from a $Ag(x)In(y)Sb2Te3$ system, where x, y are decimal numbers that can be below 1.

Doped phase change material can be used as well, where the basis stoichiometry of the phase change material is substantially uniform, such as $Ge_2Sb_2Te_5$, with dielectric doping, such as by including an additive of about 10 to 15 atomic percent, or more, silicon oxide, other dielectrics like silicon nitride. See, U.S. patent application entitled DIELECTRIC MESH ISOLATED PHASE CHANGE STRUCTURE FOR PHASE CHANGE MEMORY, application Ser. No. 12/286,874, which is incorporated by reference as if fully set forth herein.

Also, composite doping may be used, such as described in co-pending U.S. patent application Ser. No. 12/729,837, entitled PHASE CHANGE MEMORY HAVING ONE OR MORE NON-CONSTANT DOPING PROFILES, filed 23 Mar. 2010, which is incorporated by reference as if fully set forth herein.

$Ge_2Sb_2Te_5$ has a melting temperature about 175° C., and other stoichiometries can have lower melting temperatures. As will be appreciated, this temperature is approached (and may be exceeded) during the pre-heat phase of the reflow operation, and then the assembly is held well above this temperature during the reflow phase. As a result, amorphous phase material may transition to a crystalline phase, thereby losing any data that may have been stored. For this reason, PCM based memory has not been coded before mounting in the prior art.

Figure 4:
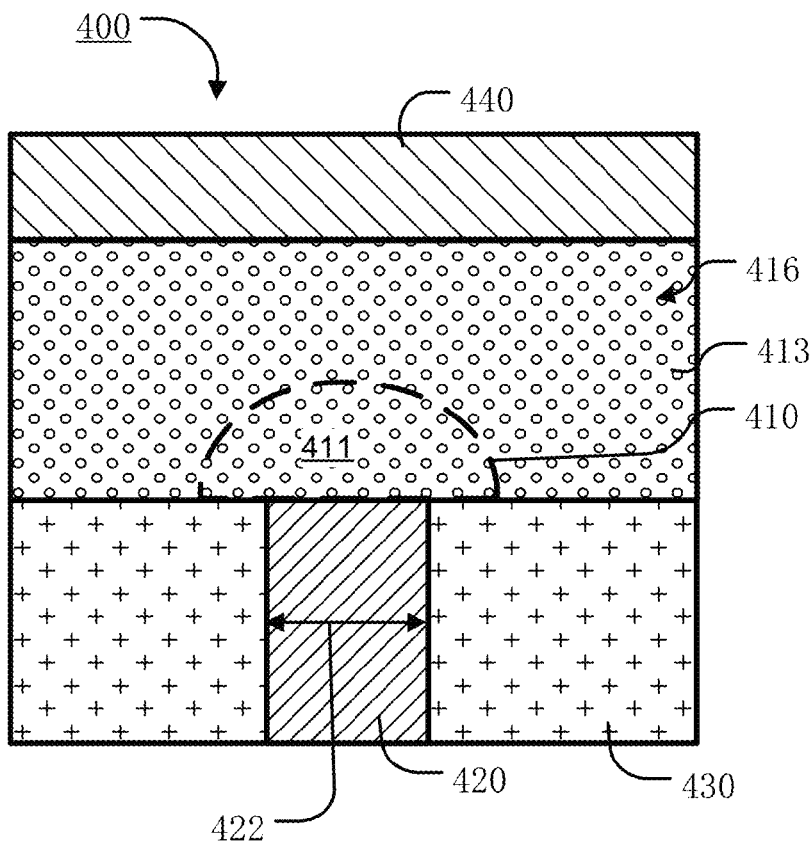
FIG. 4 is a simplified diagram of a cross-section of a phase change memory cell.

FIG. 4 illustrates a cross-sectional view of a memory cell 400 including a memory element 416 consisting of a body of phase change material. The memory cell 400 includes a first electrode 420 extending through dielectric 430 to contact a bottom surface of the memory element 416, and a second electrode 440 on the memory element 416. The first and second electrodes 420, 440 may comprise, for example, TiN or TaN. Alternatively, the first and second electrodes 420, 440 may each be W, WN, TiAlN or TaAlN, or comprise, for further examples, one or more elements selected from the group consisting of doped-Si, Si, C, Ge, Cr, Ti, W, Mo, Al, Ta, Cu, Pt, Ir, La, Ni, N, O, and Ru and combinations thereof. In the illustrated embodiment the dielectric 430 comprises SiN. Alternatively, other dielectric materials may be used.

As can be seen in FIG. 4, the relatively narrow width 422 (which in some embodiments is a diameter) of the first electrode 420 results in an area of contact between the first electrode and the memory element that is less than the area of contact between the memory element 416 and the top electrode 440. Thus, current is concentrated in the portion of the memory element 416 adjacent the first electrode 420, resulting in the active region 410 in contact with or near the bottom electrode 420, as shown. The memory element 416 also includes an inactive region 413, outside the active region 410, which is inactive in the sense that it does not undergo phase transitions during operation. The memory element includes a basis phase change material.

The basis phase change material of memory element 416 in one example comprises $Ge_2Sb_2Te_5$. The basis material can be defined as the combination of elements selected as the phase change material, and deposited with a concentration profile that is characteristic of that material. As additives are combined, the concentrations of the elements of the basis material do not change relative to one another. Rather, the basis phase change material is doped with an additive in this example which is silicon dioxide having an additive concentration profile along the inter-electrode current path between the bottom and top electrodes 420, 440. In this additive concentration profile, the silicon and oxygen components of silicon dioxide can have a combined concentration of about 15 at % (5 at % Si plus 10 at % O). As mentioned above, other phase change materials, and other additives may be used as well. The active region consists of doped phase change material 411 with the same stoichiometry as deposited of the basis material, and with a solid phase resulting from handling of the chip during manufacture, where the material has a resistance state corresponding the to initial resistance state in this example.

Figure 5:
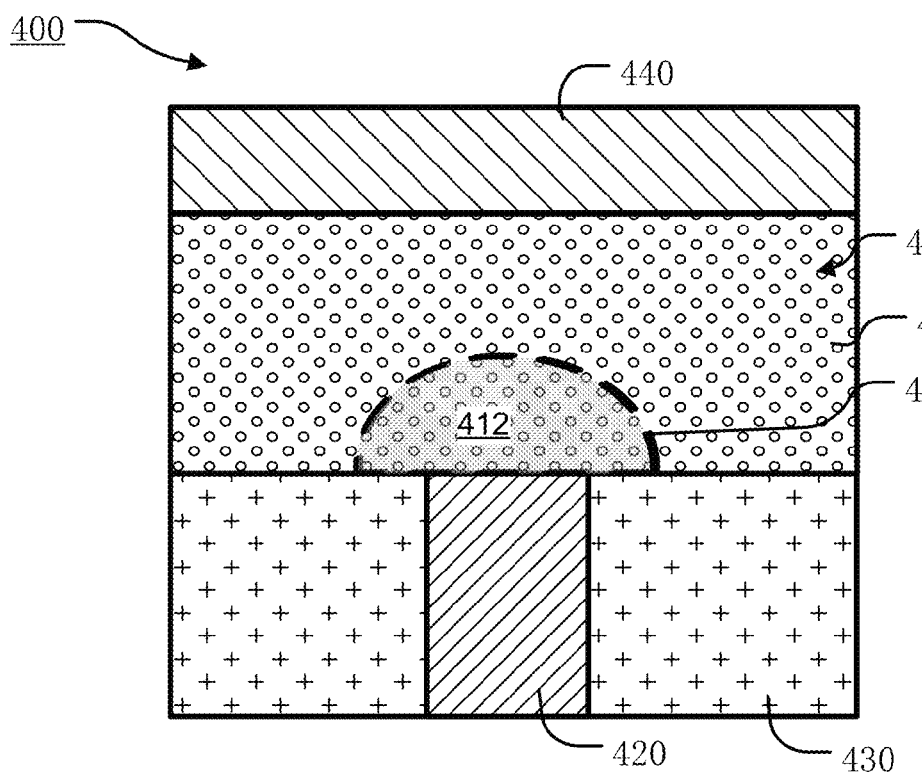
FIG. 5 is a simplified diagram of a cross-section of a phase change memory cell, like that of FIG. 4, in which the active region is in a low resistance state.

FIG. 5 illustrates heuristically, the memory cell of FIG. 4, where the active region 410 consists of doped phase change material 412, having a morphology different from that of the material in the initial state, as a result of applying a "long set pulse." It has been observed using transmission electron microscopy TEM that in an initial state after manufacturing of the device, the memory element 416 of phase change material, including the active region 410 and the inactive region 413, has a polycrystalline morphology with relatively small grain sizes uniformly distributed above the bottom electrode 420. Also, after exposing the integrated circuit to one hour of baking at 245° C., it is observed that a polycrystalline morphology of the initial state does not change in appearance in a TEM image. After a strong set pulse, as described in more detail below, the morphology changes so that the active region 410 includes a large grain of phase change material above the bottom electrode 420. Also, after exposing the integrated circuit to one hour of baking at 245° C., the large grain above the bottom electrode is remains visible in a TEM image. After a reset pulse, the active region comes amorphous above the bottom electrode. Also, after exposing the integrated circuit to one hour of baking at 245° C., the previously amorphous region is crystallized, assuming relatively small grain sizes over the bottom electrode.

In the GST based system, it has been observed that the active region undergoes a shift in stoichiometry as a result of the "long set" operation, that leads to increasing concentration of antimony. An explanation of the low resistance achieved using the long set operation could be that the antimony-rich stoichiometries of GST have relatively lower resistance, as antimony levels increase. Also, the active region 410 after a long set pulse can have large grain size, relative to the grain size that is achieved in the initial state, and in a set state induced by a typical set pulse. An explanation of the low resistance achieved using the long set operation could be that the large grain size in the active region results in a structure having fewer grain boundaries in the current path during a read, and thus have relatively lower resistance, as grain sizes increase. Also, an explanation of the low resistance achieved using the long set operation could be that the dielectric doping or other additives and the phase change material interact as result of the energy applied by the long set pulse in a manner that reduces the resistance. Any one or all of these explanations can contribute to the unique characteristics of the morphology achieved using the long set pulse. This morphology can be termed a "temperature-hardened morphology" because it has a maximum resistance that does not exceed a predetermined maximum under thermal stress. Testing shows that the thermal processes emulated by baking for 1 hour at 245° C., can be easily tolerated without loss of data using this technique.

Similar temperature-hardened morphologies can be expected in other phase change materials, as the mixing enthalpy of the materials changes with the thermodynamics of the active region, causing formation of lower resistance morphologies that are distinguishable from crystal phase morphologies adopted by memory cells in response to heating, such as by a solder bonding process or other thermal processes.

Figure 6:
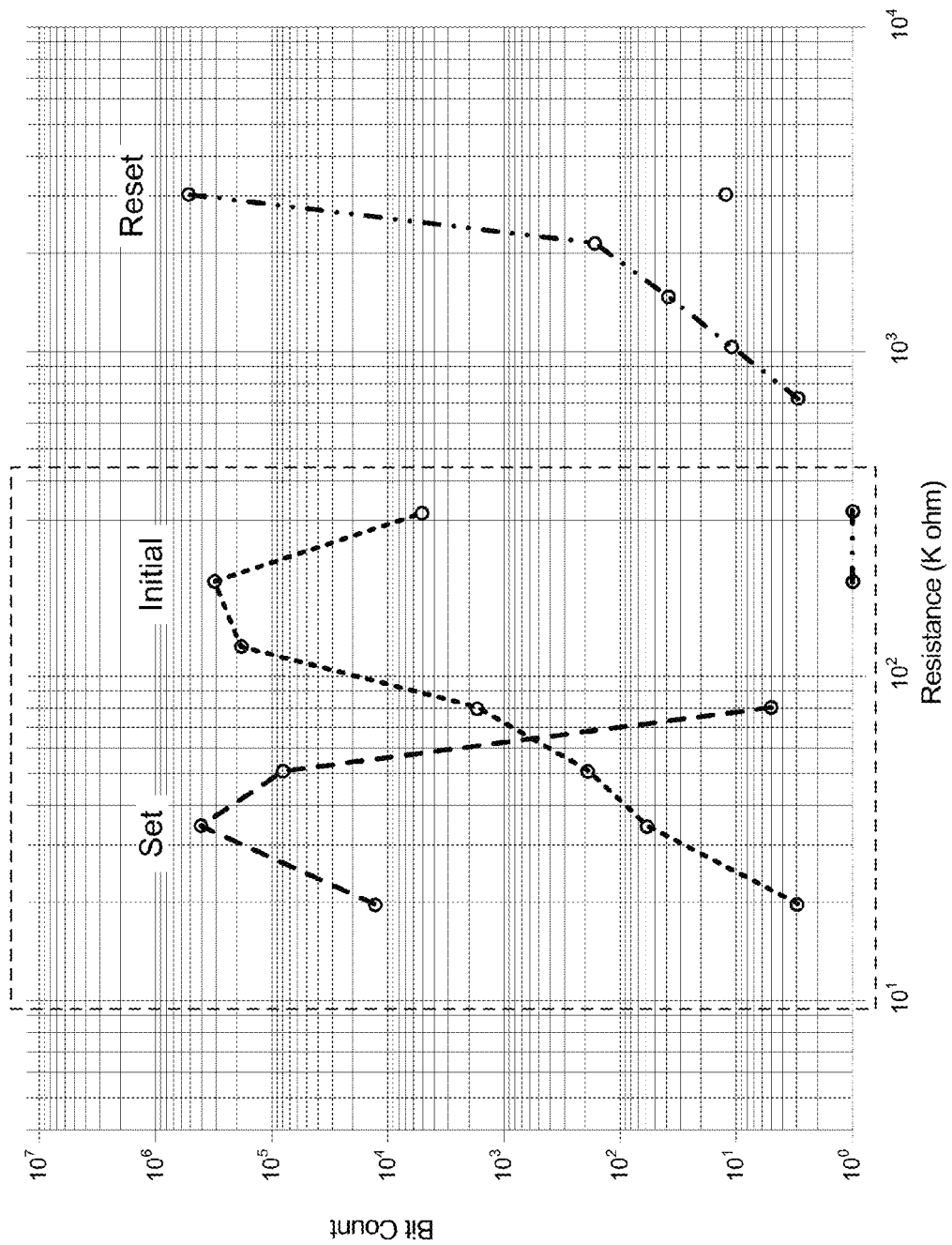
FIG. 6 is a diagram showing resistances of phase change material in memory cells at an initial state, at a state following a "set" procedure, and at a state following a "reset" procedure according to the prior art.

FIG. 6 illustrates in a log-log plot of bit count versus resistance, representative resistance states ("envelopes") for test chip configured as shown in FIG. 5, using a GST material including: an initial state; a "set" state (following a "set" operation); and a "reset" state (following a reset operation). The initial state is the state of the material following manufacture of a die including phase change material, in which processes used in manufacture can reach about 400° C. or more, and preceding any "set" or "reset" programming. In this initial state, the phase change material on the chip can assume a polycrystalline phase having resistance within the envelope labeled "Initial." A "set" operation, as noted above, is generally a lower current operation than a "reset" operation, and induced by applying a set pulse having a length typically in a range about 10 microseconds (μsec) or less at a magnitude sufficient to cause transition in the active region of a cell of amorphous phase material to a crystalline or polycrystalline phase. The "set" state can have a lower resistance than the initial state and, as a result the resistance envelope for the "set" state is lower. A "reset" operation, as noted above, is generally a higher current operation than a "set" operation, and induced by applying a reset pulse having a length typically in a range tens of nanoseconds at a magnitude sufficient to cause transition in the active region of a cell of crystalline phase material to an amorphous phase. As a result of a rapid cut off of a reset pulse, the phase change process is quenched and at least a portion of the phase change material stabilizes in the amorphous state. Because the "reset" state is more amorphous than the initial state or the "set" state, the resistance envelope for the "reset" state is higher.

Figure 7A:
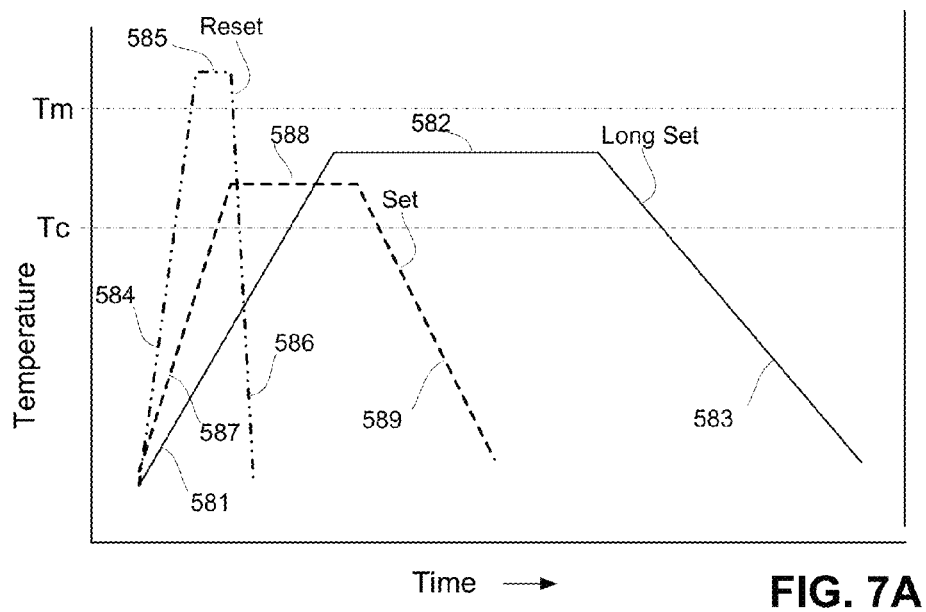
FIG. 7A is a graph of temperature versus time in an active region showing a general comparison for "set" "long set" and "reset" procedures according to an embodiment of the invention.

An improved coding method, as disclosed herein, includes a "long set pulse," resulting in a low resistance, "super-set"

state. FIG. 7A shows pulse shapes, nominally in current magnitude versus time, applied for "set", "long set" and "reset" operations. A "set" operation is induced by a pulse having a rising edge (587) on which the temperature of the phase change material increases from ambient to a temperature above the crystallization transition temperature, nominally reached where the current passes the Tc line in graph, and below the melting temperature nominally reached where the current passes the Tm line in the graph, and holding the pulse at a level (588) maintaining the material around that temperature for a time sufficient to establish a "set" state, and having a falling edge (589) that falls relatively slowly, lowering the temperature gradually to ambient so that the material settles in a crystalline phase. A "reset" operation entails sharply rising edge (584) to a magnitude that delivers sufficient energy to the active region that the temperature of the phase change material exceeds the melting temperature Tm, nominally reached where the current passes the Tm line in graph, and holding the pulse at a level (585) maintaining the temperature at about that temperature for very short time, and having a fast falling edge (586) rapidly lowering the temperature to ambient so that the material does not have time to crystallize before solidifying in the amorphous phase. A "long set" operation is induced by a pulse having a rising edge (581) on which the temperature of the phase change material increases from ambient to a temperature above the crystallization transition temperature, nominally reached where the current passes the Tc line in the graph, and below the melting temperature nominally reached where the current passes the Tm line in the graph, and holding the pulse at a level (582) maintaining the material around that temperature for a time sufficient to establish a "set" state, and having a falling edge (583) that falls relatively slowly, lowering the temperature gradually to ambient so that the material settles in a low resistance, temperature-hardened morphology and crystalline phase, establishing a "super-set" state.

As can be observed from FIG. 7A, the long set pulse delivers significantly more energy over a longer interval of time than is encountered in a typical set pulse. In the illustrated example, the peak magnitude of the long set pulse is below the current level needed to achieve melting temperature Tm. It is expected that embodiments could be implemented in which the energy delivered during a long set pulse may be sufficient to cause temperature in the active region to exceed the melting temperature Tm. However, the slower trailing edge 583 of the pulse ensures that the material in the active region will crystallize as it cools to assume the stable solid phase of the "super-set" state. The actual pulse shape of the long set pulse can be varied as suits the particular implementation, and determined empirically.

Figure 7B:
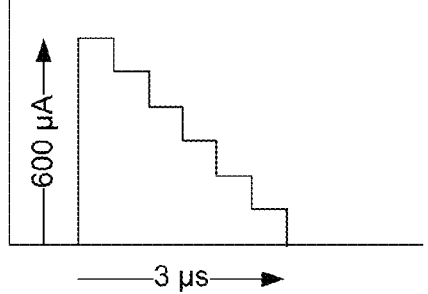
FIGS. 7B and 7C show representative current pulse shapes for normal set and long set operations, respectively.
Figure 7C:
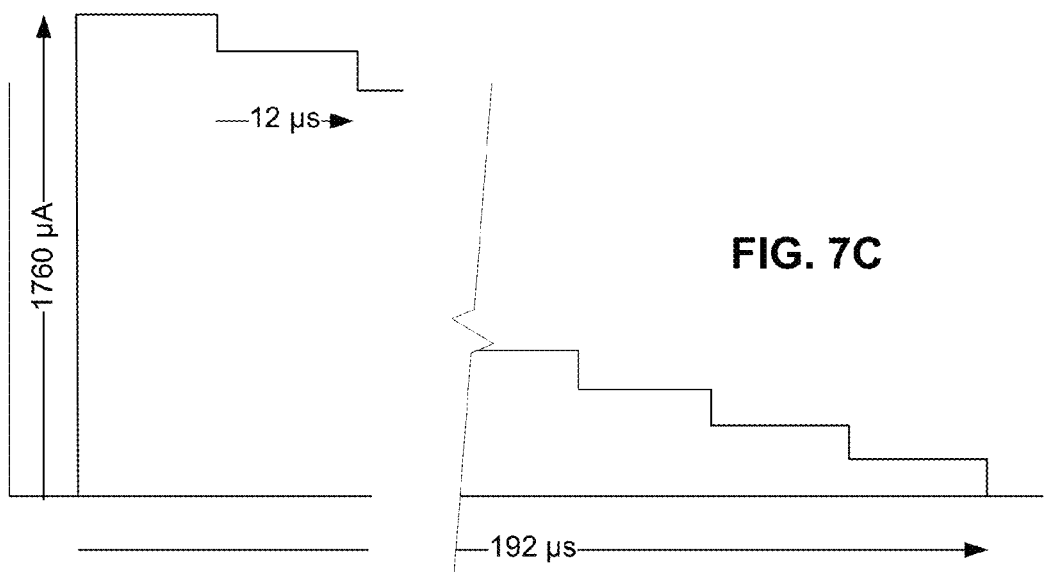

FIGS. 7B and 7C show a normal set pulse and a long set pulse respectively. In FIG. 7B, a set pulse is illustrated having a pulse length of 3 microseconds, with a maximum current of 600 microamps that steps down in six steps of 500 nanoseconds. FIG. 7C shows a long set pulse illustrated having a pulse length of 192 microseconds, with a maximum current of 1760 microamps that steps down in sixteen steps of 12 microseconds. A more typical long set pulse would be substantially shorter, with lower magnitude. However, the long set pulse will have substantially more energy than a standard set pulse, providing energy needed for kinetic changes in the active region allowing formation of the temperature-hardened, long set morphology.

A long set pulse can be characterized as having significantly more energy content (integral of power over time), than the energy content of a set pulse used to establish the higher resistance state. For example, it is known that a long set pulse having at least 10 times the energy content of a standard set pulse can induce the temperature-hardened state. In examples, a long set pulse having more than 100 times the energy content of a standard set pulse can induce the temperature-hardened state. In some embodiments, it is expected that a long set pulse having at least 2 times the energy content of a standard set pulse can induce the temperature-hardened state, depending on the size and configuration of the memory cell, and the composition of the phase change material.

FIGS. 7D-7L illustrate a variety of pulse shapes for long set operations which can be applied to cause the lower resistance, modified morphology in the active region of the body of phase change material for the cell.

Figure 7D:
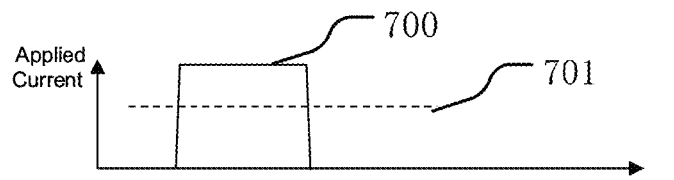
FIGS. 7D-7L illustrate alternative pulse shapes for long set pulses.

In FIG. 7D, a single square pulse 700 of relatively long duration and rapid rising and falling edges is applied, with an amplitude above the melting threshold 701 for the phase change material to cause a cumulative duration in the high temperature phase sufficient for formation of the strong set morphology in the active region. Representative pulse widths can range from about 0.5 millisecond to over 200 milliseconds, depending upon the materials used, the configuration of the memory cell, the number of memory cells in the array, the specified life of the cell in number of set/reset cycles, and other factors.

Figure 7E:
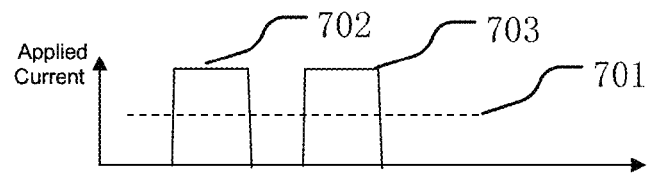

FIG. 7E shows that the long set operation can be applied as a sequence of square pulses 702, 703 which cause a cumulative duration in the high temperature phase sufficient for formation of the strong set morphology in the active region.

Figure 7F:
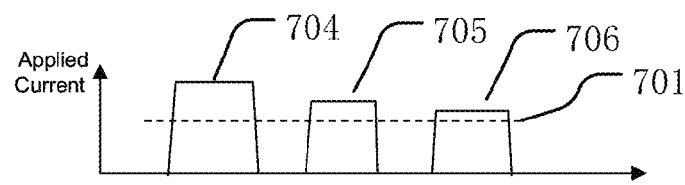

FIG. 7F shows that the long set operation can be applied as a sequence of square pulses 704, 705, 706 having stepped down magnitudes, which cause a cumulative duration in the high temperature phase sufficient for formation of the strong set morphology in the active region. The stepped down magnitudes may prevent formation of interfacial layers and localized anomalies in the structure.

Figure 7G:
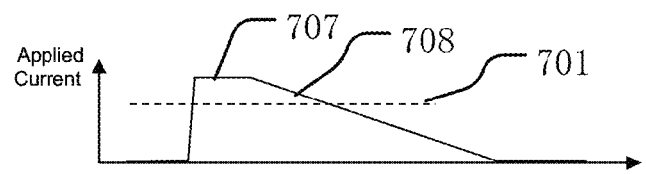

FIG. 7G shows that the long set operation can be applied as a single pulse 707 with a rapid rising edge and a ramp-shaped trailing edge or tail 708 of constant or near constant slope, which causes a cumulative duration in the high temperature phase sufficient for formation of the strong set morphology in the active region. The tail 708 of the forming pulse can let the atoms move more gently without a sudden stop (quench), thus preventing the forming of an interface layer in the active region. For pulses having a fast trailing edge which ramps to zero in an interval shorter than a quench cutoff, the fast trailing edge could be considered as a "quench" which results in the material solidifying in the active region in the amorphous phase. This quench cutoff is about 10 nanoseconds in a phase change material based on $Ge_2Sb_2Te_5$, and will be different for different phase change materials. In the embodiment shown in FIG. 7G, the trailing edge ramps for a time interval significantly greater than the quench cutoff, e.g. more that twice the quench cutoff, and can be 5 to 10 times longer, or more.

Figure 7H:
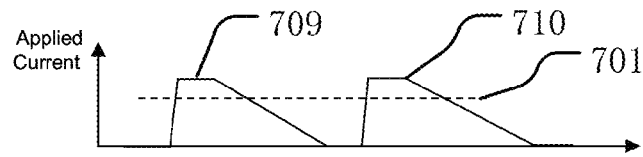

FIG. 7H shows that the long set operation can be applied as a sequence of pulses 709, 710 having sloped trailing edges with relatively long tails of constant or near constant slope, which cause a cumulative duration in the high temperature phase sufficient for formation of the strong set morphology in the active region. For a pulse having a peak current sufficient to cause a temperature in the active region over the melting threshold for a first duration for the phase change material, the sloped trailing edge in which the current magnitude drops over a time interval significantly greater than the quench cutoff, in this example can reduce interface formation within the body of phase change materials.

Figure 7I:
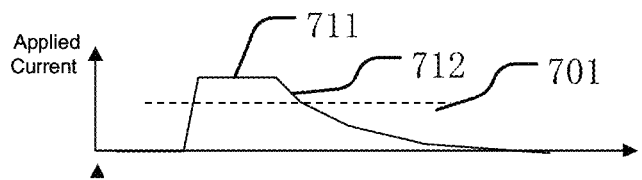

FIG. 7I shows that the long set operation can be applied as a single pulse 711 with a rapid rising edge and a ramp-shaped, or sloped, trailing edge or tail 712 of changing slope, going from a relatively high negative slope to a slope close to zero over the length of the trailing edge, which causes a cumulative duration in the high temperature phase sufficient for formation of the strong set morphology in the active region. For a pulse having a peak current sufficient to cause a temperature in the active region over the melting threshold for a first duration for the phase change material, the sloped trailing edge in which the current magnitude drops over a time interval greater than the quench cutoff, in this example can reduce interface formation within the body of phase change materials.

Figure 7J:
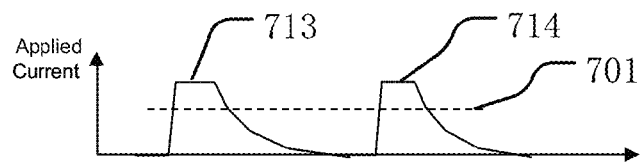

FIG. 7J shows that the long set operation can be applied as a sequence of pulses 713, 714 having ramped trailing edges with relatively long tails of changing slope, which cause a cumulative duration in the high temperature phase sufficient for formation of the strong set morphology in the active region. Each pulse in the sequence, or only a final pulse in the sequence can be characterized by having a peak current sufficient to cause a temperature in the active region over the melting threshold for a first duration for the phase change material, and a sloped trailing edge in which the current magnitude drops over a time interval significantly greater than the quench cutoff.

Figure 7K:
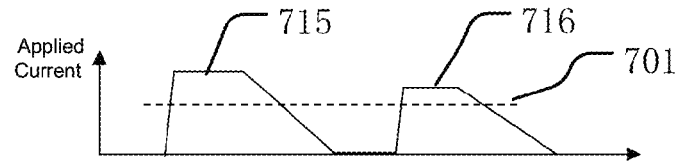

FIG. 7K shows that the long set operation can be applied as a sequence of pulses 715, 716 with amplitudes stepping down, and having sloped trailing edges with relatively long tails of constant or near constant slope, which cause a cumulative duration in the high temperature phase sufficient for formation of the strong set morphology in the active region. Each pulse in the sequence, or only a final pulse in the sequence can be characterized by having a peak current sufficient to cause a temperature in the active region over the melting threshold for a first duration for the phase change material, and a sloped trailing edge in with the current magnitude drops over a time interval significantly greater than the quench cutoff.

Figure 7L:
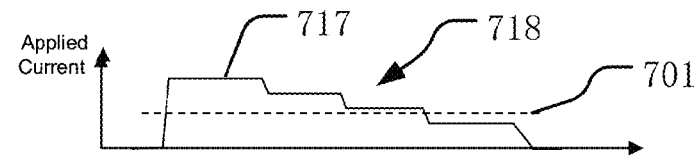

FIG. 7L shows that the long set operation can be applied as a single pulse 717 with a rapid rising edge and a sloped trailing edge implemented by a stepping down trailing edge or tail 718, which causes a cumulative duration in the high temperature phase sufficient for formation of the strong set morphology in the active region.

FIGS. 7D-7L show a variety of pulse shapes for long set operation. Of course, other pulse formats and pulse sequences can be applied to achieve the result of causing formation of the strong set morphology in the active region.

Figure 7M:
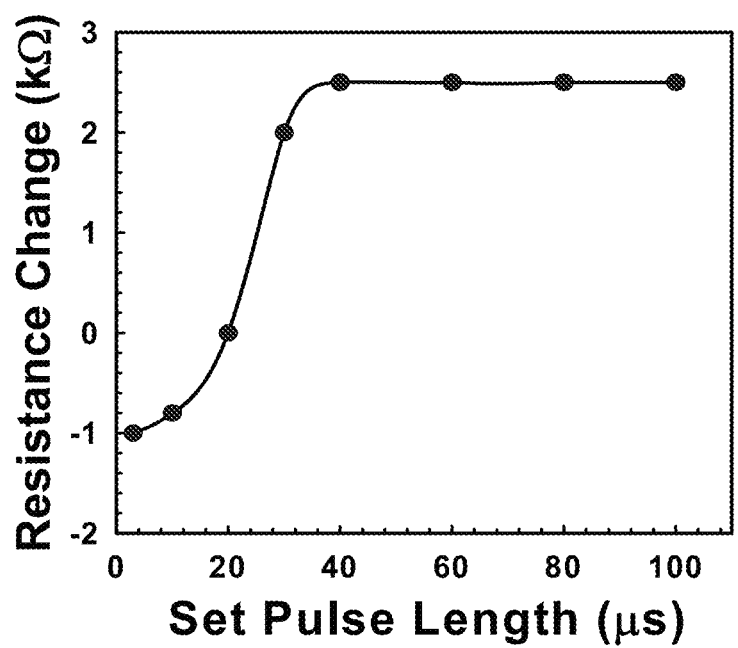
FIG. 7M is a graph showing resistance drift due to thermal loading versus set pulse length.

FIG. 7M is a graph of a change in resistance (resistance drift) due to baking for 1 hour at 245° C. for phase change material versus set pulse length. For a given pulse magnitude, a shorter pulse length leaves the active region in morphology that undergoes negative resistance drift due to baking. The resistance drift is positive for longer pulse lengths, and saturates when the temperature-hardened morphology is established, at a shift of about 2.5 K ohms for pulse lengths longer than about 60 microseconds in this example. For the dielectric doped GST material used in these examples, a long set pulse between 10 and 100 microseconds duration, with a maximum current magnitude between 1 milliamp and 100 microamps which is stepped to zero in 10 to 20 equal steps, or ramped to zero from the peak near the beginning of the pulse to zero at the end, can move the resistance distribution of the long set cells below 10 K ohms. Longer and/or multiple long set pulses may be needed to tighten the distribution of the long set cells. For embodiments of the technologies described here, a long set pulse can be characterized as a current pulse sufficient to cause the active region to assume a morphology in which the resistance drift saturates, due to high temperature baking of the sort described here.

FIGS. 8A-8D illustrate resistance states in an array operated as described herein. In this example, the processed and annealed cells prior to programming (FIG. 8A) are in an initial state 692. Coding for some cells is carried out using a "long set" operation for some cells and a "soft-set" operation for other cells, to establish "super-set" 698 (FIG. 8B) and "soft-set" 694 states (FIG. 8C), respectively, in selected cells to code a data set. Later the chip can be mounted or subjected to other thermal events, including for example a solder reflow procedure. As noted above, the resistance envelopes of the "super-set" and "soft-set" states are substantially undisturbed by the thermal events. Optionally, the mounted chip may be subjected to a "reset" operation to switch the cells in a "super-set" state to a "reset" state 696 (FIG. 8D), and a "set operation" to switch the cells in the "soft-set" state to a "set" state (not shown).

Figure 8A:
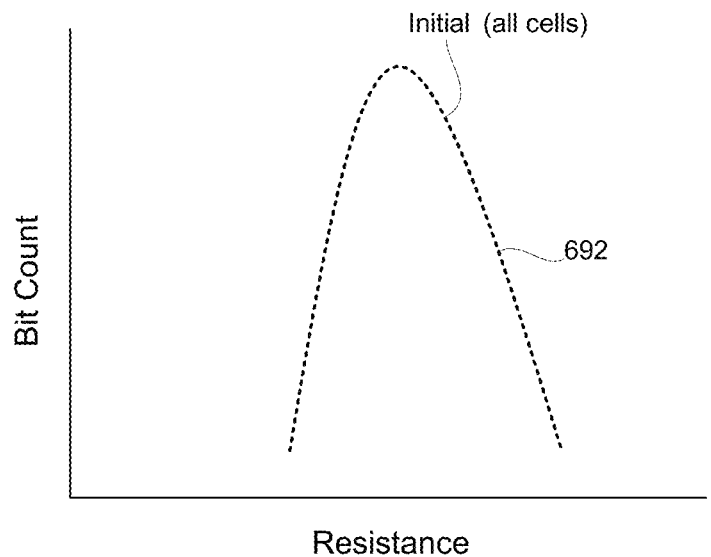
FIGS. 8A-8D are diagrams showing resistance of phase change material in memory cells at various stages in a cell programming procedure according to an embodiment of the invention.
Figure 8B:
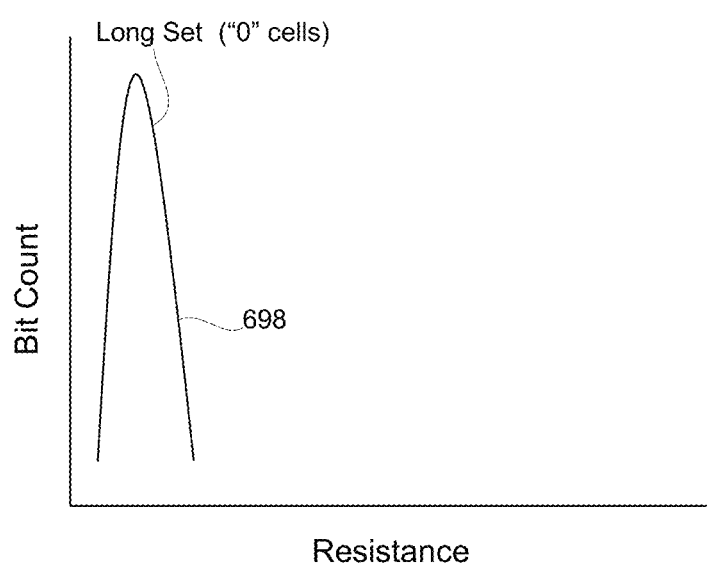
Figure 8C:
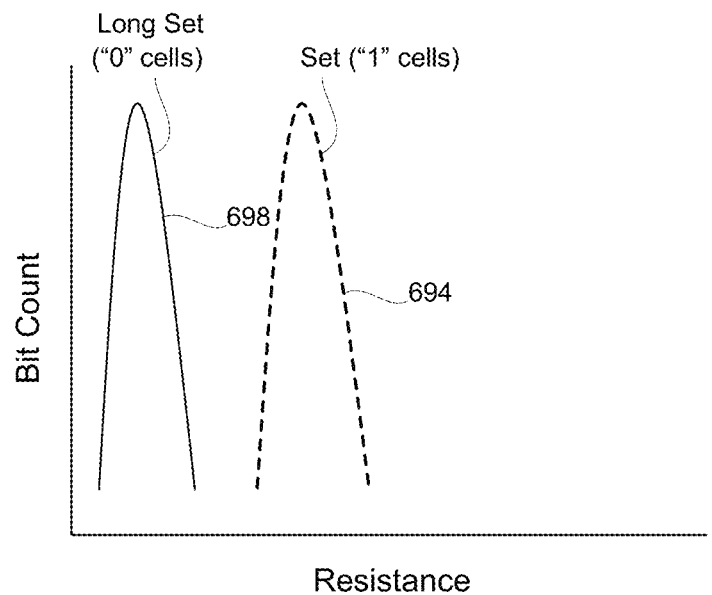
Figure 8D:
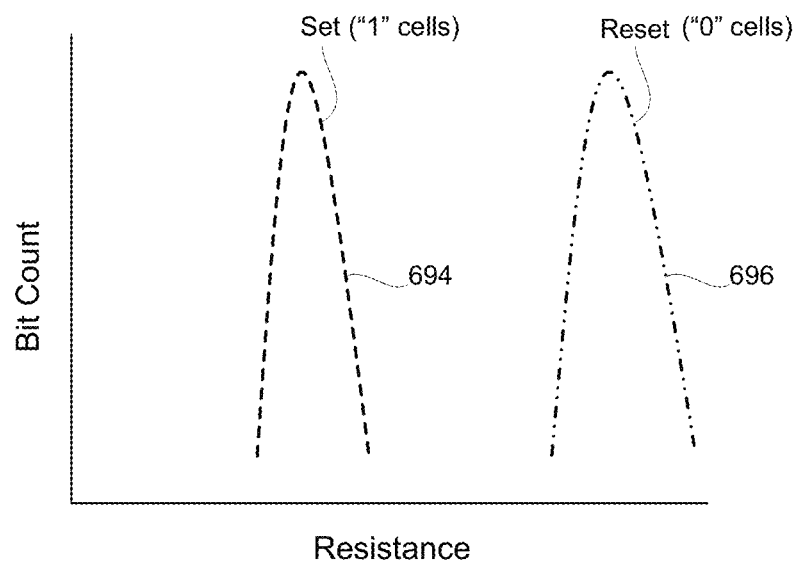

In FIG. 8D, the "set" state cells are read as "1" cells and the "reset" state cells are read as "0" cells. Alternatively, the "set" state cells could be read as "0" cells and the "reset" state cells could be read as "1" cells. A sufficient "window" appears between the "set" and "reset" state resistance envelopes to enable the sense circuitry to discriminate between them; that is, the sense circuitry unambiguously reads a given cell as either "0" or "1".

Data can be coded for using the long-set pulse for one data value, and any one of the initial state, reset state or set state as the other data value. The use of the long set pulse to establish a low resistance state enables the use of crystalline phase morphologies for storing 1 bit of data per cell, as distinguished from multibit cells that utilize a reset state for one of the data values, and more than one crystalline phase morphology for the more than one other data values.

Figure 9A:
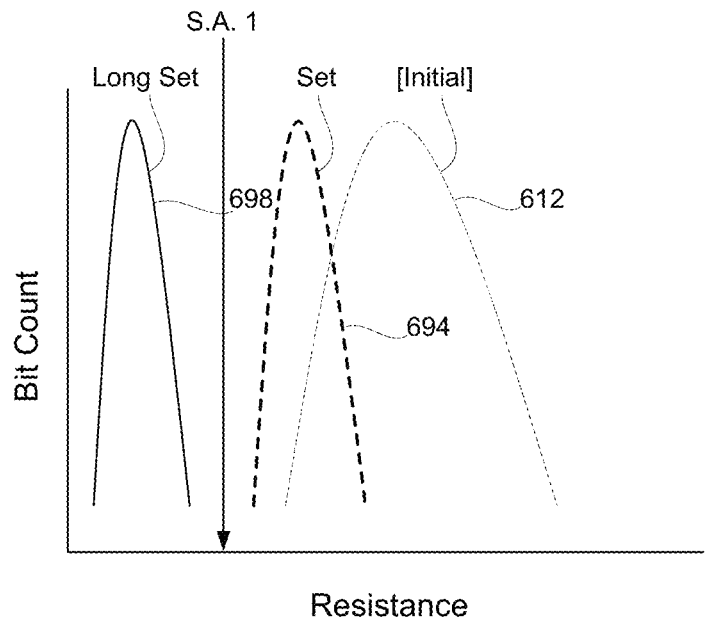
FIGS. 9A and 9B are diagrams showing a relationship of sense amplifier settings and cell resistances in first and second modes as described herein.
Figure 9B:
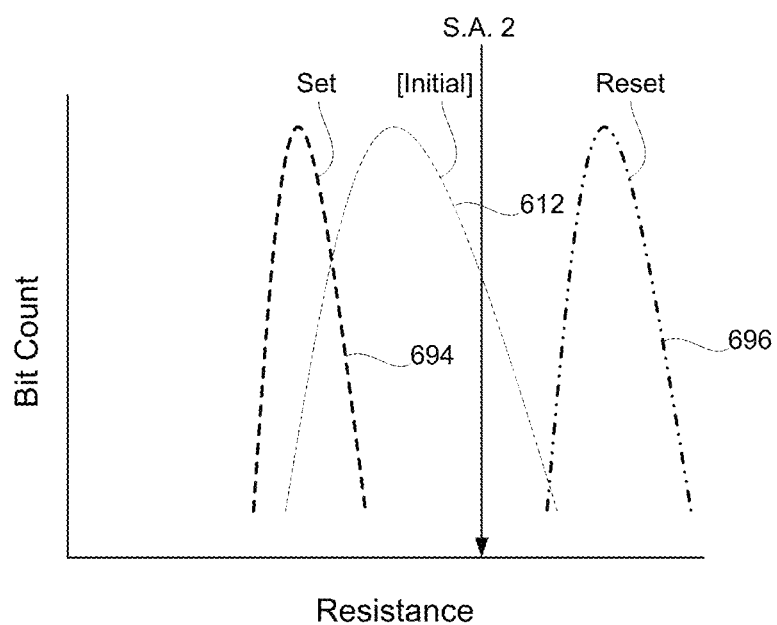

Phase change memory devices can be designed which operate using the long set mode in the field. In alternatives, after mounting, the integrated circuit can be configured to change from the long set mode to a standard mode in order to improve the speed of operation. The sense circuitry for embodiments using technology to change the writing processes from the long set mode to more typical set and reset modes, is capable of operating in at least two sense amplify modes: one for sensing after "set" and "long set" operations and prior to solder bonding; and the other for sensing after "set" and "reset" operation following solder bonding. This is illustrated in FIGS. 9A and 9B. The sense amplify level following "set" and "long set", before solder bonding (FIG. 9A) must operate in the sensing window between the "super-set" state resistance envelope 698 and the "soft-set" state resistance envelope 694, as indicated by the arrow marked S.A. 1. The sense amplify level following solder bonding, the "set" and "reset" operations (FIG. 9B) must operate in the sensing window between the "set" or "soft-set" state resistance envelope 694 and the "reset" state resistance envelope 696, as indicated by the arrow marked S.A. 2. The initial state resistance envelope 692 is shown here as well, and can be used to represent a data value in some embodiments.

Figure 10:
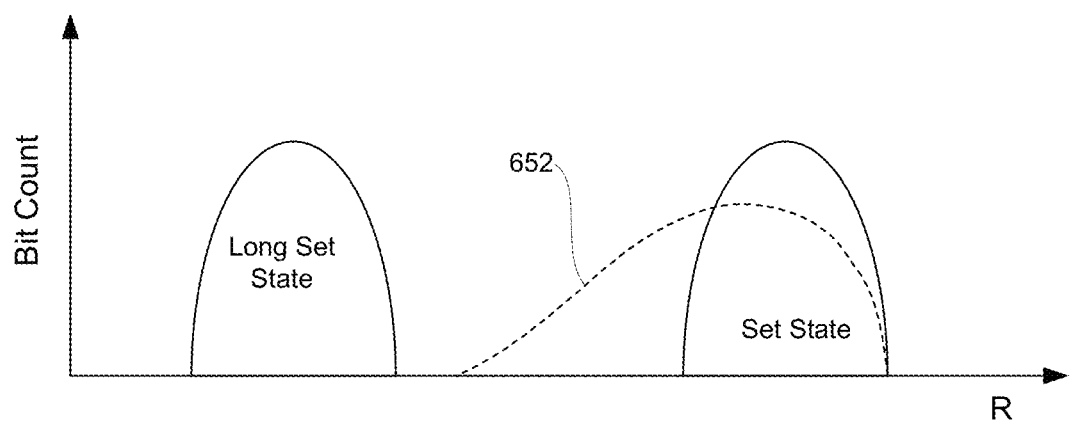
FIG. 10 is a diagram showing heuristically an effect on cell resistance of subjecting a chip to a thermal cycle after coding using the long set and set processes described herein.

FIG. 10 is a graph showing emulation in which the phase change material is heated to temperatures and for times corresponding to those of a solder reflow procedure, suggesting that the lower resistance state envelope, induced by the long set pulse, is substantially unchanged by the thermal cycling; and the higher resistance state, such as induced by "soft-set" pulse or "soft-reset" pulse, is slightly broadened as enclosed by broken line 652 in FIG. 10, and shifted lower to achieve a range of resistances with a minimum resistance that exceeds the maximum resistance of the temperature-hardened, lower resistance state.

The pre-coding "soft-set" state may also be implemented using a "soft-reset" operation to implement the second higher resistance state for the pre-coded device. A "soft-reset" operation involves applying a reset pulse to cells that are to adapt to cause a second higher resistance state. The reset pulse results in formation of an amorphous phase active region, before the thermal cycle encountered during mounting. The amorphous phase active region may shift to a lower resistance crystalline phase during the thermal cycle, so that the minimum resistance of the higher resistance state is provided by the crystalline phase morphology that results from the drift in resistance from the amorphous phase under thermal stress. However, the resulting second resistance state ensures that a cell has a resistance higher than the lower resistance state even after the thermal cycle. The minimum resistance of the higher resistance state is provided by a crystalline phase morphology that is different in one or more of grain size, stoichiometry, or dielectric doping structures, than the temperature-hardened morphology of the lower resistance state.

Figure 11:
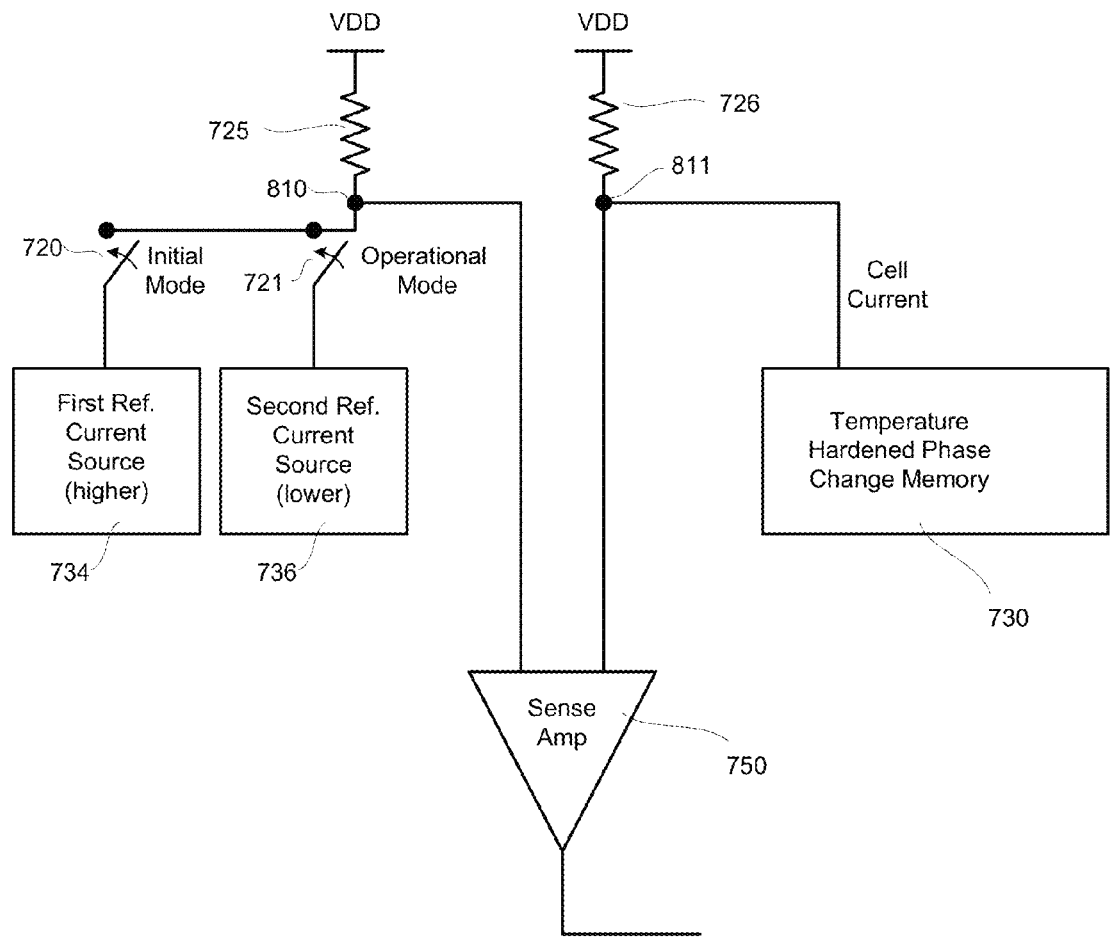
FIG. 11 is an example of a sense amplifier circuit suitable for use in connection with a memory array according to an embodiment of the invention.

FIG. 11 is a simplified diagram of a temperature-hardened phase change memory device a memory array 730 and including sense circuitry capable of operating in two sensing modes. The circuit is provided with two reference current sources 734, 736 switchably coupled to a reference node 810 and the load circuits (represented by resistor 725) of sense amplifier 750: one reference current source 734 for use in an initial mode in response to engaging switch 720; and the other reference current source 736 for use in an operational mode in response to engaging switch 721. The phase change memory array 730 is coupled to a sensing node 811 and load circuits 726 of the sense amplifier 750, through appropriate decoding and biasing circuits. Control logic (See, FIG. 12) on the chip controls the switching between modes using switches 720 and 721, or other appropriate control circuits. A variety of multi-mode sense amplifier circuits are used in the art for sensing multilevel cells, and such circuits are readily adaptable to the present use.

Figure 12:
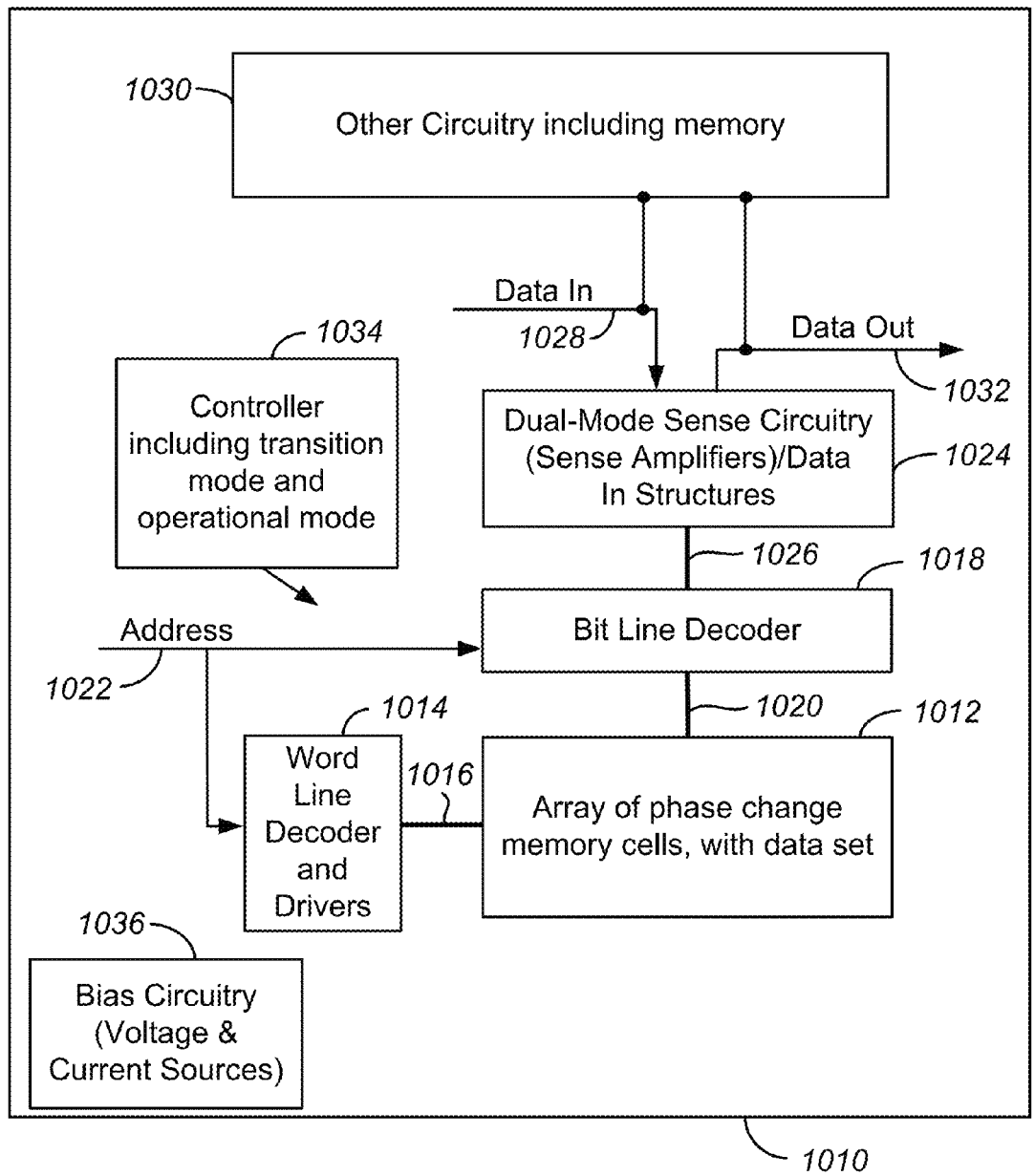
FIG. 12 is a simplified block diagram showing an integrated circuit including a PCM memory array with transitional and operational modes as described herein.

FIG. 12 is a simplified block diagram of an integrated circuit 1010 including a memory array 1012 implemented using memory cells having dual mode sensing circuits as described herein, supporting pre-coding of the phase change memory. A word line decoder 1014 is coupled to and in electrical communication with a plurality of word lines 1016 arranged along rows in the memory array 1012. A bit line (column) decoder 1018 is in electrical communication with a plurality of bit lines 1020 arranged along columns in the array 1012. Addresses are supplied on bus 1022 to word line decoder and drivers 1014 and bit line decoder 1018. Dual mode sense circuitry (sense amplifiers) and data-in structures in block 1024, are coupled to bit line decoder 1018 via data bus 1026. Data is supplied via a data-in line 1028 from input/output ports on integrated circuit 1010, or from other data sources internal or external to integrated circuit 1010, to data-in structures in block 1024. Other circuitry 1030 may be included on integrated circuit 1010, such as a general purpose processor or special purpose application circuitry, or a combination of modules providing system-on-a-chip functionality supported by array 1012. Data is supplied via a data-out line 1032 from the sense amplifiers in block 1024 to input/output ports on integrated circuit 1010, or to other data destinations internal or external to integrated circuit 1010.

A controller 1034 implemented in this example, using a state machine, controls the application voltage and current from the voltage and current sources in bias circuitry 1036 for the application of bias arrangements for the phase change memory array. The control circuits and biasing circuits coupled to the array are arranged to execute transition processes to read the data set with the sensing circuits in the first mode by sensing the first and second resistance states, and to change cells in the first resistance state to a third resistance state and to change cells in the second resistance state to a fourth resistance state so that the data set is readable with the sensing circuits in the second mode, to execute write processes to write data in the array by inducing the third and fourth resistance states in addressed cells, and to execute read processes to read data in the array with the sensing circuits in the second mode by sensing the third and fourth resistance states. The controller 1034 may be implemented using special-purpose logic circuitry as known in the art. In alternative embodiments, controller 1034 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 1034.

Figure 13:
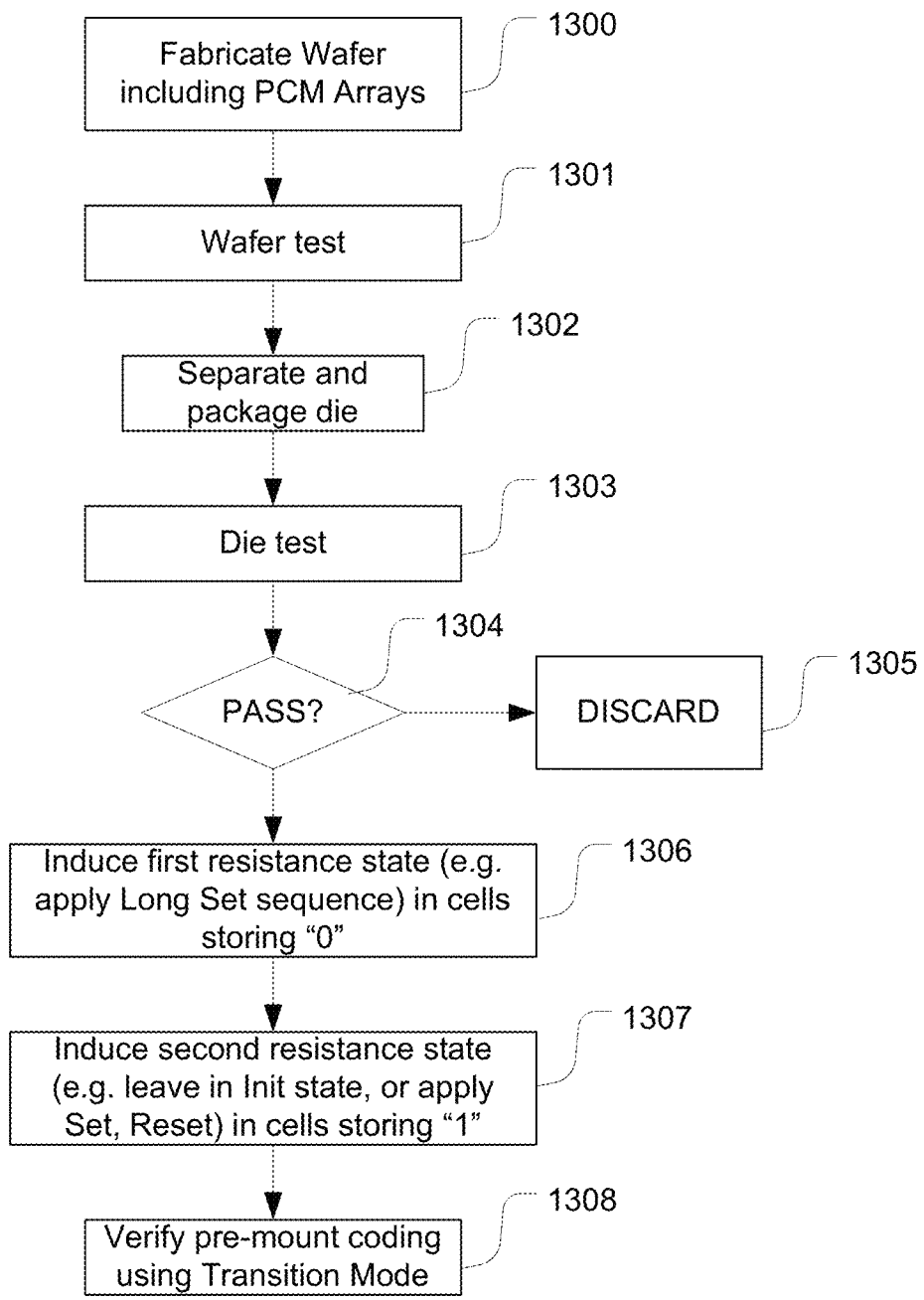
FIG. 13 is a flow chart showing a pre-mounting write process as described herein.

FIG. 13 is a flow chart of a process for pre-coding a data set in a phase change memory chip during manufacturing. The manufacturing process includes fabricating a wafer including chips that include phase change memory arrays (1300). Commonly, a wafer test sequence is applied using wafer level testing equipment to characterize the performance of, and to detect failed chips on the wafers (1301). Next, the die on the wafer are separated and packaged in a single chip or multichip package suitable for delivery to the customer, such as an original equipment manufacturer or other customer who will mount the chip package on a circuit board or other substrate (1302). Commonly, the individual packages, or die, are tested again using test equipment which can be on an assembly line within a packaging factory, or elsewhere (1303). If the individual die fail the testing (1304), they may be discarded or otherwise processed (1305). If the individual die pass the testing (1304), then a pre-coding operation can be executed. The pre-coding operation can be controlled exclusively by on-chip logic in the controller, or controlled by the chip programming equipment coupled with the die, or a combination of use of the on-chip logic and programming equipment can be used. In alternatives, the pre-coding can be implemented at the wafer test stage before packaging of the die. In an example implementation, the program equipment can be programmed to deliver a command interpreted as a pre-coding command, followed by address and data information for the data set to be coded, using the input and output resources on the chip having the phase change memory array. The on-chip controller is configured to provide a state machine that can then automatically execute a process to address the array, control the biasing circuitry, and control the timing and operation of the memory array, to perform the pre-coding. The pre-coding as described herein includes inducing a lower resistance state in cells storing logic "0", such as by applying a long set sequence including one or more long set pulses (1306). In some embodiments, it may be desirable to apply sequence of long set pulses in order to reduce tail bits in the resistance distribution for cells storing the logic "0". Also, the pre-coding includes inducing a higher resistance state in cells storing a logic "1", such as by leaving cells in the initial state, or by applying a set pulse or a reset pulse (1307). It is noted that the assignment of logic "0" and "1" to the first and second resistance states respectively could be reversed. In some embodiments it may be desirable to use "soft" set pulses or "soft" reset pulses in order to induce the second resistance state. The "soft" set pulses have a shorter duration or lower magnitude than standard set pulses. The "soft" reset pulses have a lower magnitude than standard reset pulses. The use of "soft" pulses for inducing the second resistance state may improve endurance of the phase change memory arrays being operated in this manner.

After writing a data set in the phase change memory array using the lower and higher resistance states, the manufacturing process can include a step for verifying the pre-coding (1308). The verifying step involves reading the data set using the transition mode setting for the sensing circuitry, and comparing it to the input data set to verify successful programming. The verifying operation can be controlled by on-chip logic in the controller, controlled by the test equipment coupled with the die, or controlled by a combination of use of the on-chip logic and test equipment can be used. For example, the programming equipment can deliver a command interpreted as a pre-coding verify command, followed by address and data information for the data set to be verified, using the input and output resources on the chip having the phase change memory array. The on-chip controller is configured to provide a state machine that can then automatically execute a process to address the array, control the biasing circuitry, and control the timing and operation of the memory array, to perform the read and compare processes needed to verify successful pre-coding. After verifying the pre-coding, the chip can be carried forth in a manufacturing process for mounting the chip on a printed circuit board or other substrate. A similar process can be used to set the state of phase change memory cell based fuses.

Figure 14:
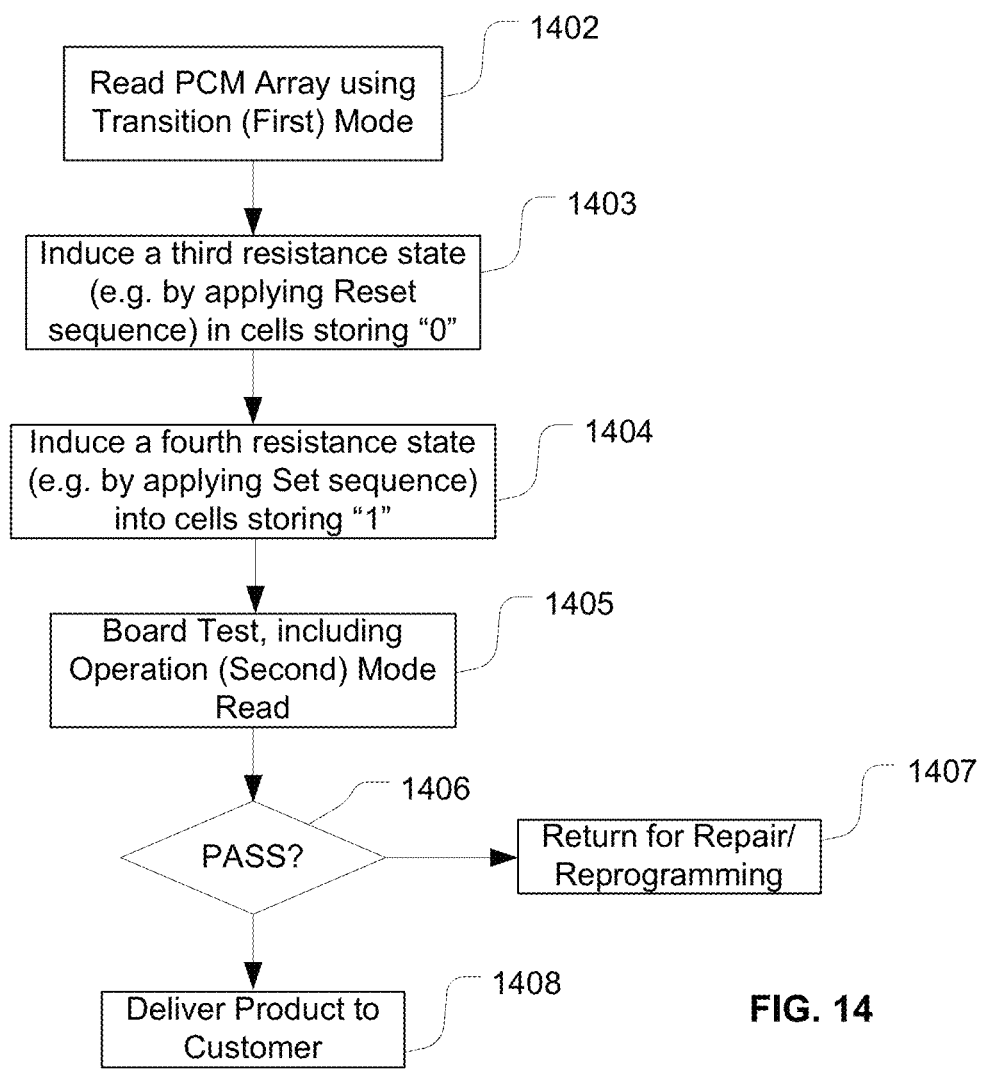
FIG. 14 is a flow chart showing a transition mode for post-mounting read followed by write process as described herein.

FIG. 14 is a flowchart of a post mounting refresh for one embodiment. As explained above, a pre-coded phase change memory in a circuit board or other substrate, in which the pre-coded data is stored using the long set mode, can be refreshed using standard set and reset operations. Thus, in a manufacture process a set of "designed-in" chips for a circuit board is gathered, including a pre-coded phase change memory, and perhaps other pre-coded memory chips. Also, in some embodiments known as system-on-a-chip SOC devices, a single chip including a phase change memory array and other circuitry is provided at this stage. Next, the chips (or chip) are mounted on a circuit board or other substrate, using a process which can involve a thermal cycle. The mounting process can result in the phase change cells in the lower resistance state to assume the first resistance state (which may be essentially unchanged from the lower resistance state), and phase change cells in the higher resistance state to assume the second resistance state (which may have a broadened or lower resistance distribution than the original higher resistance state). For refresh after a solder bonding or other thermal event, the data set which had been pre-coded in the phase change memory array is read using the transition mode settings in the sense amplifiers, sensing the first and second resistance states (1402). The data read in this manner can be stored using an on-chip buffer, or alternatively off-chip memory available on the circuit board so that it may be written back. The data is written back using the operational mode for the phase change memory that is suitable for the mission function of the product in which is being applied. Thus, the process includes inducing a third resistance state in cells storing logic "0", by for example applying a reset sequence to induce a typical reset state (1403). Also, the process includes inducing a fourth resistance state in cells storing logic "1", by for example applying a set sequence to induce a typical set state (1404). The transition mode read operation and the write back processes for the operational mode can be controlled by on-chip logic in the controller, controlled by the test equipment coupled with the board, or controlled by a combination of use of the on-chip logic and test equipment can be used. For example, the test equipment can deliver a command interpreted in the test mode as a transition mode read command, followed by address and data information for the data set to be read, using the input and output resources on the chip having the phase change memory array. The on-chip controller is configured to provide a state machine that can then automatically execute a process to address the array, control the biasing circuitry, and control the timing and operation of the memory array, to perform the transition mode read processes and operational mode write-back needed for changing the resistance states of the cells storing the data to the operational mode resistance states.

After the transition mode used to change the pre-mount resistance states to the operational mode resistance states, a board test can be executed, including a read process to verify accuracy of the code, or test the operation of the code executed using the operational mode of the sensing circuitry (1405). It can be determined whether the board passes the testing at step 1406. If the board fails the testing, it can be returned for repair or reprogramming (1407). If the board passes the testing, the product can be delivered to a customer or otherwise passed on the manufacturing process to create a finished product (1408).

Figure 15:
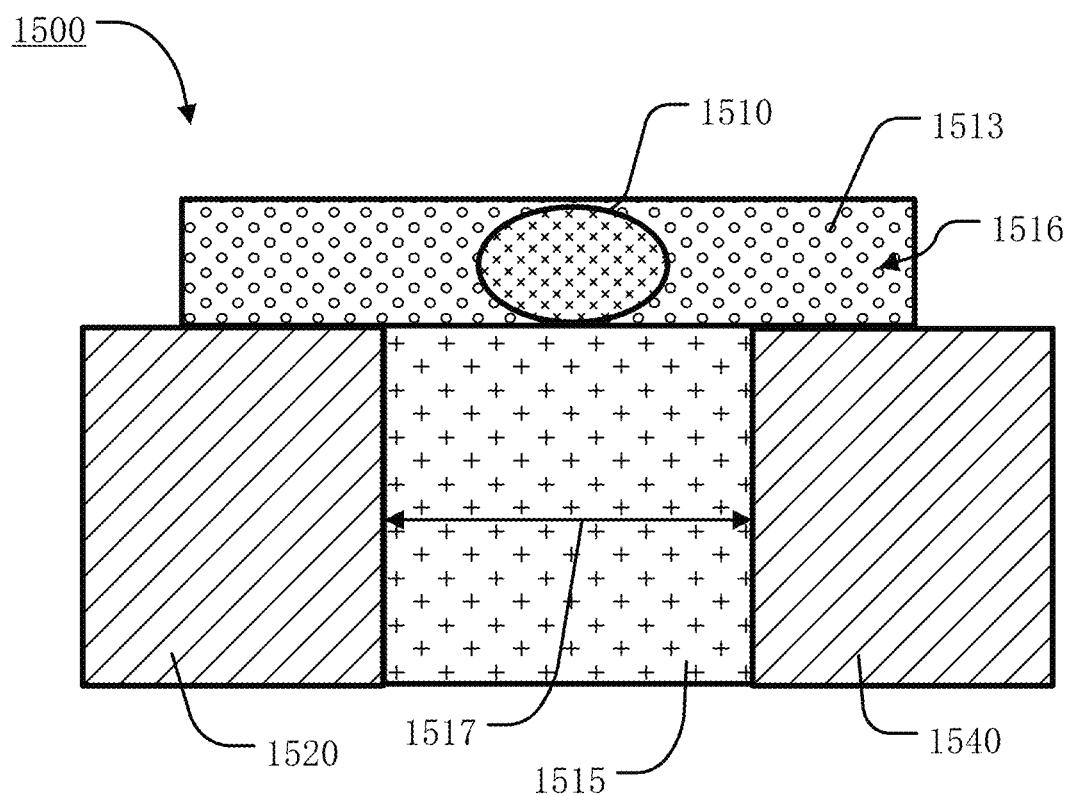
FIGS. 15-17 are simplified diagrams of cross-sections of alternative phase change memory cell configurations.
Figure 16:
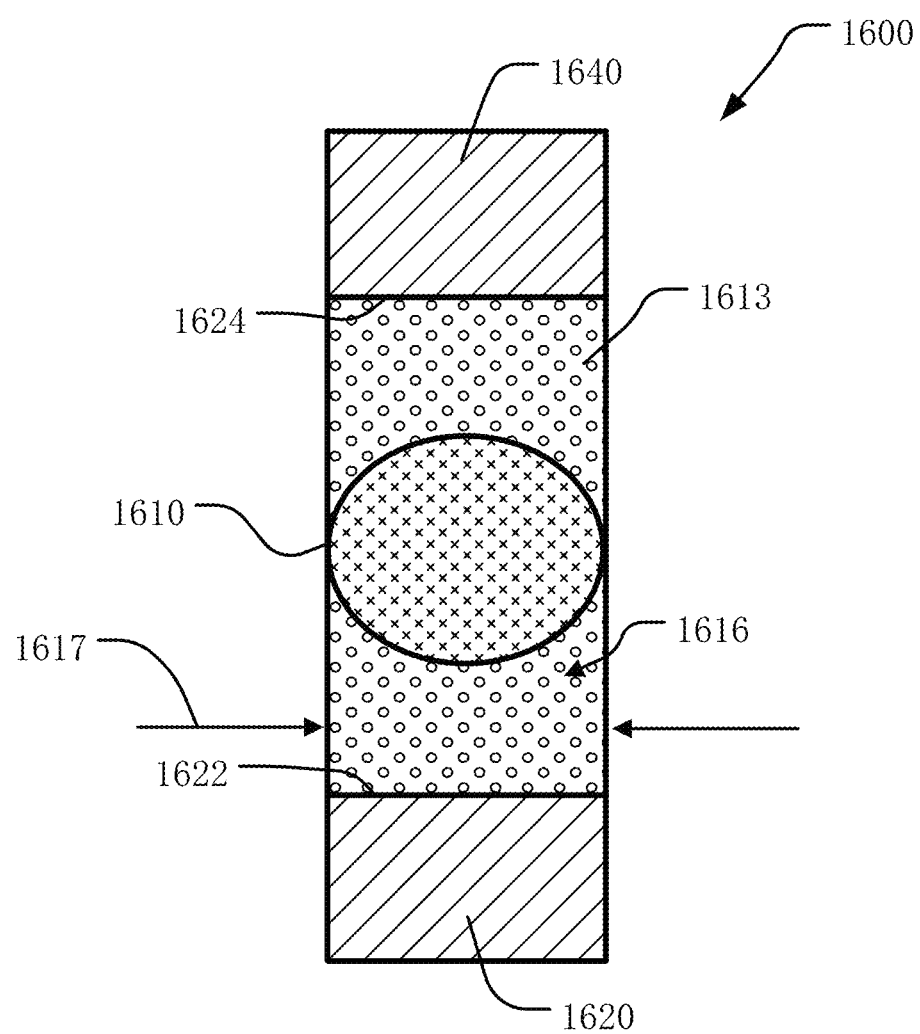
Figure 17:
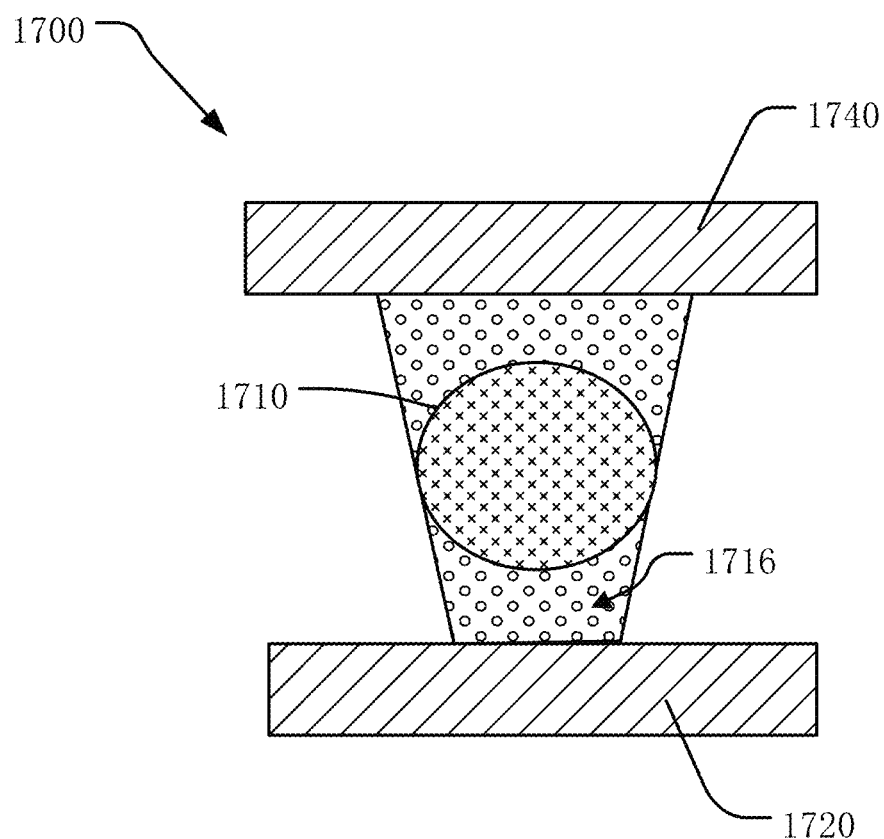

FIGS. 15-17 illustrate some of the alternative structures for memory cells which can be used in phase change memory devices operated as described herein. The materials described above may be implemented in the memory cells of FIGS. 15-17, and thus a detailed description of these materials is not repeated.

FIG. 15 illustrates a cross-sectional view of a memory cell 1500 including a memory element 1516 consisting of a body of phase change material along an inter-electrode current path through memory element 1516. The active region 1510 can comprise phase change material having morphologies as discussed above, corresponding to the resistance states used to represent data in the cell.

The memory cell 1500 includes a dielectric spacer 1515 separating first and second electrodes 1520, 1540. Memory element 1516 extends across the dielectric spacer 1515 to contact the first and second electrodes 1520, 1540, thereby defining an inter-electrode current path between the first and second electrodes 1520, 1540 having a path length defined by the width 1517 of the dielectric spacer 1515. In operation, as current passes between the first and second electrodes 1520, 1540 and through the memory element 1516, the active region 1510 heats up more quickly than the remainder (e.g. inactive region 1513) of the memory element 1516.

FIG. 16 illustrates a cross-sectional view of a memory cell 1600 including a memory element 1616 consisting of a body of phase change material along an inter-electrode current path through memory element 1616. The active region 1610 comprises phase change material having morphologies as discussed above, corresponding to the resistance states used to represent data in the cell.

The memory cell 1600 includes a pillar-shaped memory element 1616 contacting first and second electrodes 1620, 1640 at top and bottom surfaces 1622, 1624, respectively. The memory element 1616 has a width 1617 substantially the same as that of the first and second electrodes 1620, 1640 to define a multi-layer pillar surrounded by dielectric (not shown). In operation, as current passes between the first and second electrodes 1620, 1640 and through the memory element 1616, the active region 1610 heats up more quickly than the remainder (e.g. inactive region 1613) of the memory element.

FIG. 17 illustrates a cross-sectional view of a memory cell 1700 including a memory element 1716 consisting of a body of phase change material along an inter-electrode current path through memory element 1716. The active region 1710 comprises phase change material having morphologies as discussed above, corresponding to the resistance states used to represent data in the cell. The memory cell 1700 includes a pore-type memory element 1716 surrounded by dielectric (not shown) contacting first and second electrodes 1720, 1740 at top and bottom surfaces respectively. The memory element has a width less than that of the first and second electrodes, and in operation as current passes between the first and second electrodes and through the memory element the active region heats up more quickly than the remainder of the memory element.

Figure 18:
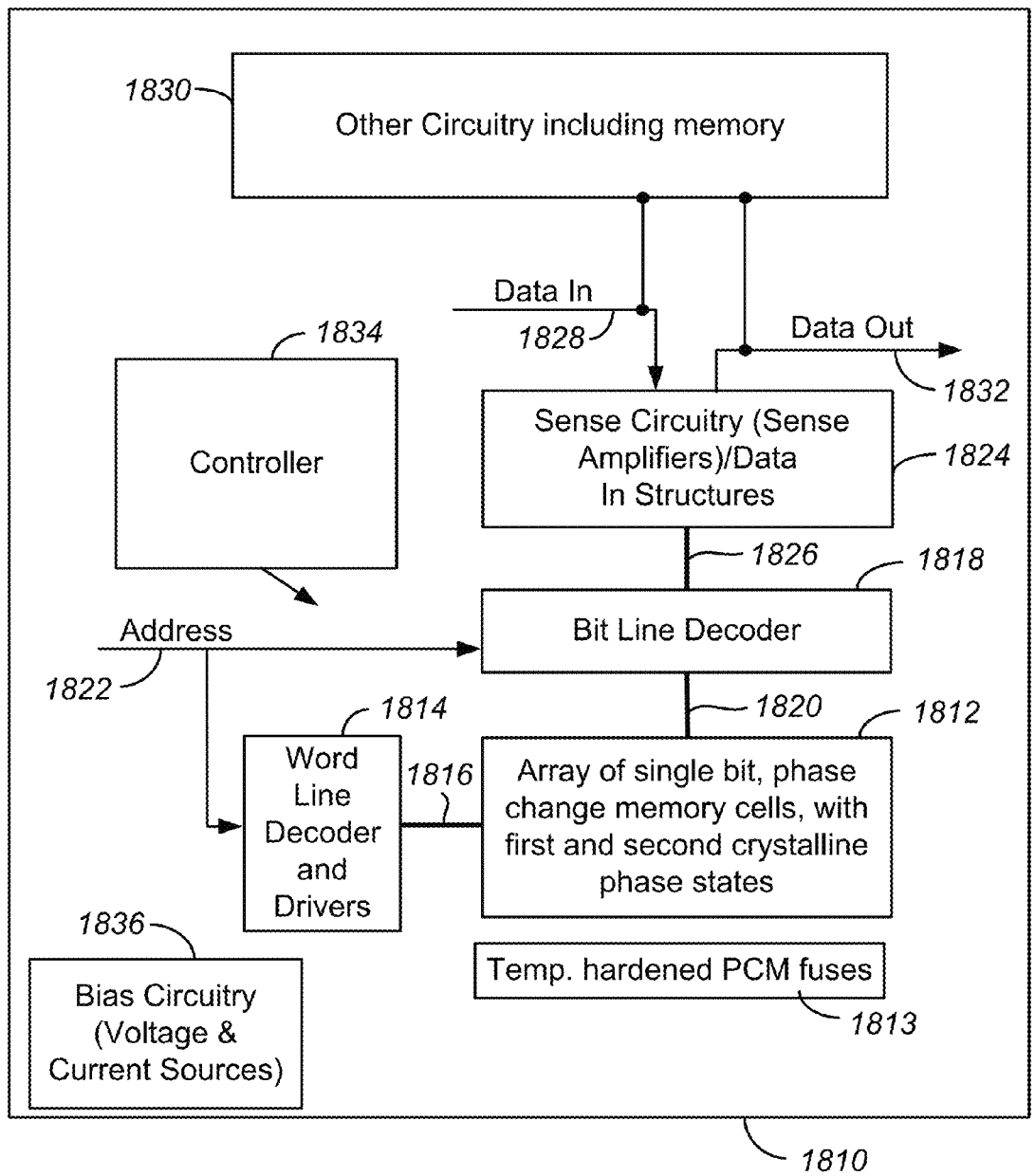
FIG. 18 is a simplified block diagram of a temperature-hardened phase change memory as described herein.

FIG. 18 is a simplified block diagram of an integrated circuit 1810 including a memory array 1812 implemented using memory cells having a temperature-hardened phase change memory as described herein. The memory cells store a single bit in which both data values (0 and 1) are represented by crystalline phase morphologies, including the temperature-hardened morphology for the lower resistance state, and a higher resistance state that includes a minimum resistance that is provided by a crystalline phase morphology different from the temperature-hardened morphology. A word line decoder 1814 is coupled to and in electrical communication with a plurality of word lines 1816 arranged along rows in the memory array 1812. A bit line (column) decoder 1818 is in electrical communication with a plurality of bit lines 1820 arranged along columns in the array 1812. Addresses are supplied on bus 1822 to word line decoder and drivers 1814 and bit line decoder 1818. Sense circuitry (sense amplifiers) and data-in structures in block 1824, are coupled to bit line decoder 1818 via data bus 1826. Data is supplied via a data-in line 1828 from input/output ports on integrated circuit 1810, or from other data sources internal or external to integrated circuit 1810, to data-in structures in block 1824. Other circuitry 1830 may be included on integrated circuit 1810, such as a general purpose processor or special purpose application circuitry, or a combination of modules providing system-on-a-chip functionality supported by array 1812. Data is supplied via a data-out line 1832 from the sense amplifiers in block 1824 to input/output ports on integrated circuit 1810, or to other data destinations internal or external to integrated circuit 1810. As illustrated, phase change memory cells coded using the temperature-hardened morphology can be used a fuses 1813, coding for redundancy or other uses on an integrated circuit.

A controller 1834 implemented in this example, using a state machine, controls the application voltage and current from the voltage and current sources in bias circuitry 1836 for the application of bias arrangements for the phase change memory array. The control circuits and biasing circuits coupled to the array are arranged to execute processes to read the data set with the sensing circuits by sensing the first and second resistance states, and to execute write processes to write data in the array by inducing the first and second resistance states in addressed cells using the long set process for the lower resistance state, and one of the typical or soft set and typical or soft reset, for the higher resistance state. The controller 1834 may be implemented using special-purpose logic circuitry as known in the art. In alternative embodiments, controller 1834 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 1834.

Figure 19:
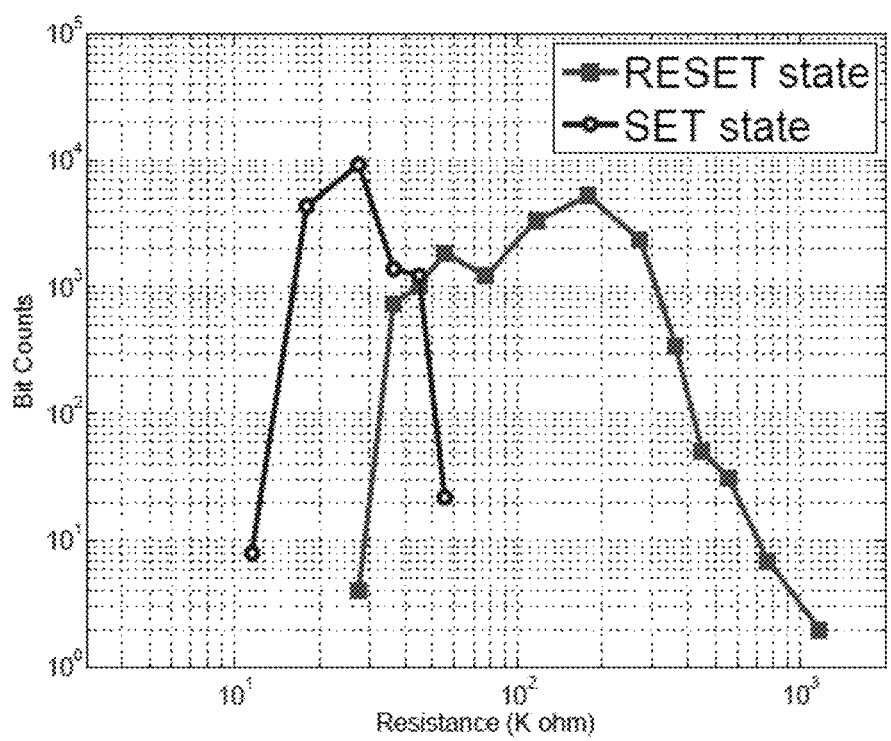
FIG. 19 is a graph of reset and set state resistance distributions after a 245° C. 1 hr baking for a test chip.
Figure 20:
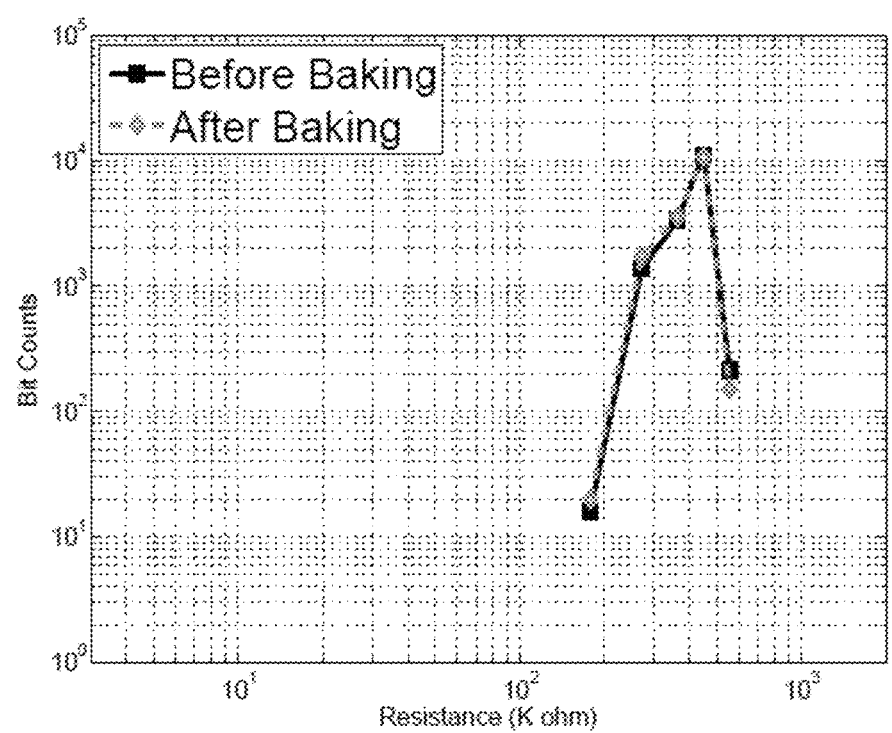
FIG. 20 is a graph of initial state resistance distributions before and after the 245° C. 1 hr baking for a test chip.
Figure 21:
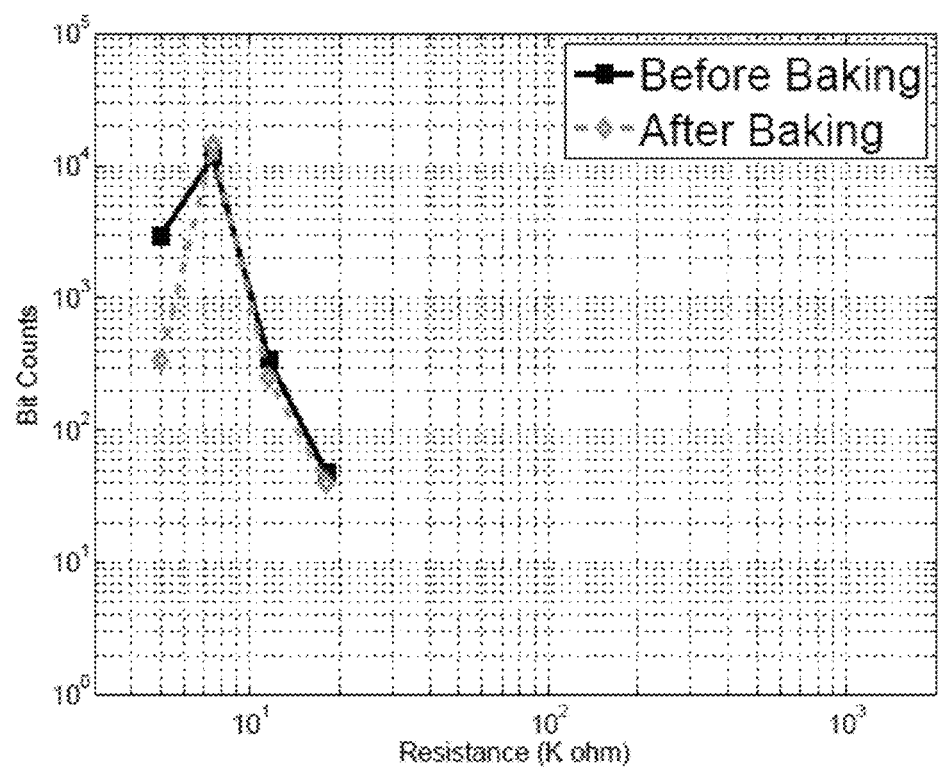
FIG. 21 is a graph of set state resistance distributions before and after the 245° C. 1 hr baking for a test chip.
Figure 22:
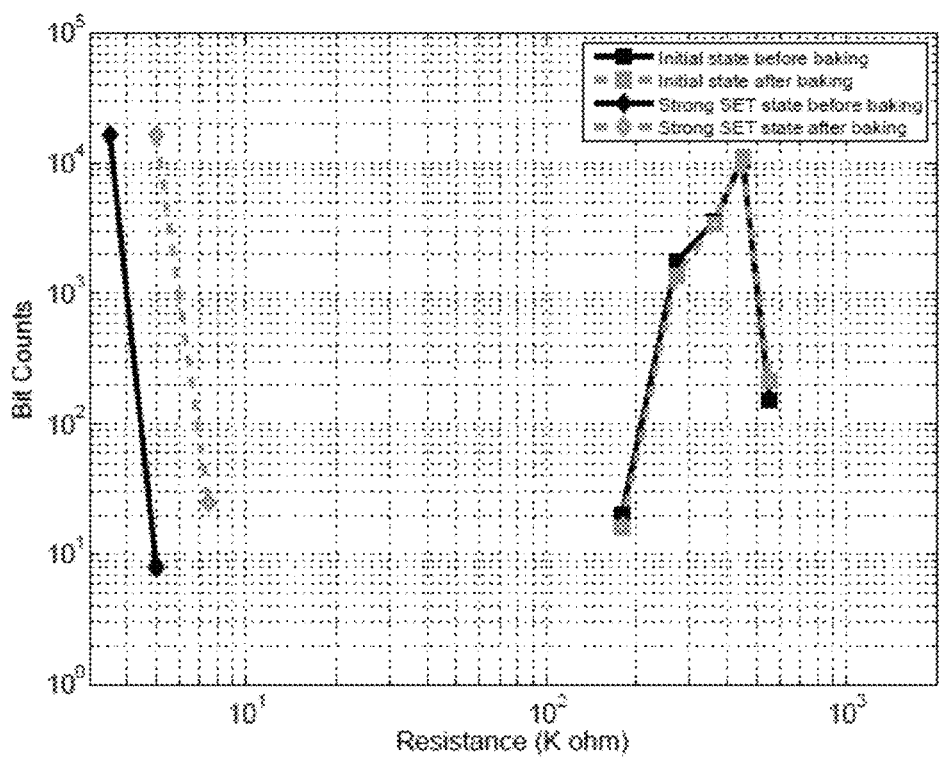
FIG. 22 is a graph of strong set state and initial state resistance distributions before and after the 245° C. 1 hr baking.

Evaluations were carried out using vehicle comprising a 0.18 um embedded PCM test chip set, having a structure like that of FIG. 5. The bottom electrode diameter in the test chip was from 30 nm to 50 nm in diameter, with reset current between 300 uA and 1 mA. FIG. 6, described above, shows a typical set, reset, and initial state resistance distribution of a test chip. Set and reset state resistance distributions overlapped after 245° C. baking (FIG. 19). FIG. 20 shows that the emulated soldering process does not change the initial state resistance distribution of the PCM cells. This may be due to the maximum temperature of the BEOL process is approximately 400° C., which is much higher than the solder bonding temperature. On the other hand, the temperature experienced by the PCM cells during the set operation is substantially higher than the maximum BEOL process temperature. Hence, it would be reasonable to expect that the set state should not change after a 245° C. bake either. FIG. 21 shows that the set resistance with a set pulse of 20 μs is unchanged after baking. These results suggest that two differently programmed set (crystalline) states will be able to retain distinct resistance distributions after the solder bonding process. The solution for achieving distinct states which can survive the solder bonding process is to program the "0" state cells with a stronger set condition. The "1" state cells can be programmed into the reset state, or for an even larger margin (post solder bonding) the "1" state cells can be un-programmed, i.e. left in the initial state. As shown in FIG. 22, the initial state distribution before and after baking remains very stable.

Figure 23:
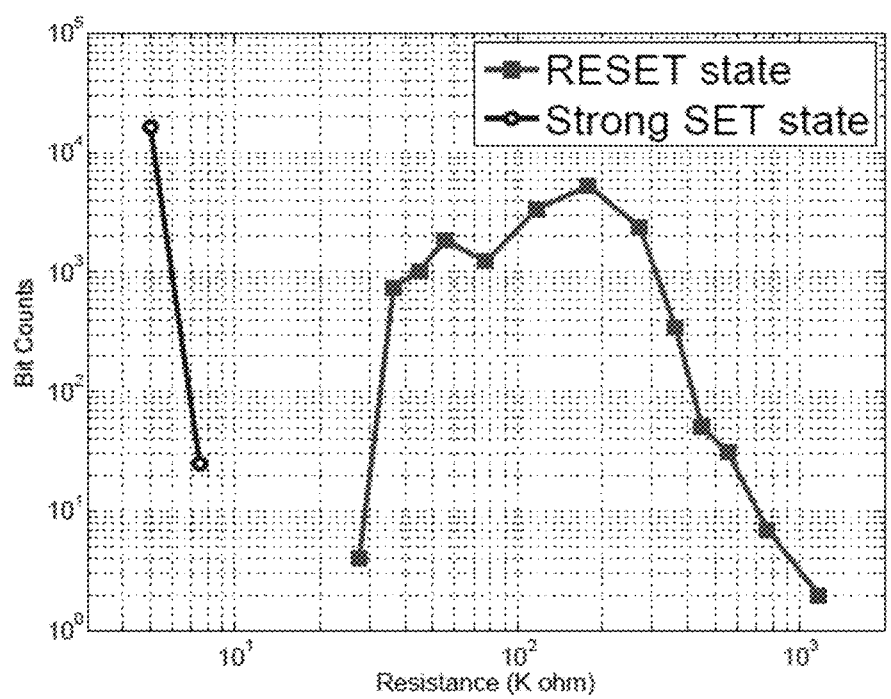
FIG. 23 is a graph of strong set state and reset state resistance distributions after the 245° C. 1 hr baking

FIG. 7M discussed above shows that the post 245° C./1 hr baking resistance drift of a set state depends on the set pulse duration. Shorter (<20 μs) set pulses result in a negative resistance drift and longer set pulses (>20 us) result in a positive resistance drift. The positive resistance drifting saturates at 2.5 KΩ when the set pulse is longer than 60 us. The resistance of the strongly set cells is kept below 10 KΩ in order to achieve an adequate resistance margin after soldering. Typically, 10 us~100 us of set pulse duration is long enough, depending on magnitude, cell structure and so on, to move the main resistance distribution of the strongly set cells to below 10 KΩ. Longer and multiple set pulses may be required to tighten the resistance distribution. The post bake resistance distribution of strongly set cells is below 8 KΩ and this generates a 100 kΩ resistance difference compared to the initial state cells (FIG. 22). The post 245° C./1 hr baking memory window between strongly set cells and reset cells is about 4 KΩ (FIG. 23). These results confirm the feasibility of this programming method for implementation of a reliable PCM pre-solder-bonding coding scheme.

Figure 24:
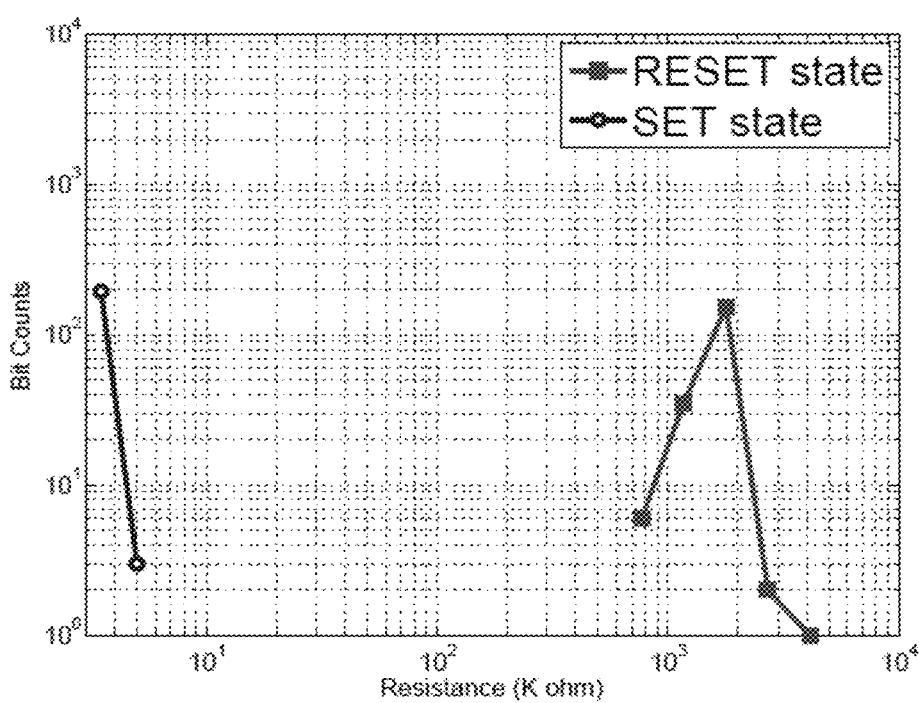
FIG. 24 is a graph of set and reset state resistance distributions of strong set cells after a 10M cycling endurance test. The memory window is larger than one order of magnitude

To investigate the effect of this strong set operation plus the 245° C. bake on PCM reliability, cells programmed and baked with this condition were then cycled using standard set and reset programming conditions. FIG. 24 shows that the strongly set cells can be cycled more then 10 million times after the emulated soldering baking process without degradation. Transmission Electron Microscopy (TEM) is used to analyze the physical phenomena behind these operations. Compared to the initial state, the long set operation generates temperature-hardened morphology having a larger grain region above the bottom electrode which can contribute to reduction of the resistance of the cell. Low Angle Annular Dark Field Scanning Transmission Electron Microscopy (LAADF-STEM) has been used to analyze the post-baking cells in order to achieve increased contrast for examining the grain sizes. Baking the initial state cell does not change the grain size. This can explain the un-changed resistance of the initial state cell pre and post bake. The strongly set cells have a larger grain size and fewer grain boundaries compared to the re-crystallized reset state cells after 245° C./1 hr baking This can explain why the strongly set cells have a lower resistance than the re-crystallized reset cells.

What is claimed is:

1. An integrated circuit, comprising:
   an array of phase change memory cells;
   sensing circuits coupled to the array, the sensing circuits having a first mode and a second mode, the first mode sensing data values in the array in response to first and second resistance states, and the second mode sensing data values in the array in response to third and fourth resistance states, wherein the first and second resistance states represent a first and second data values respectively, and the third and fourth resistance states represent the first and second data values respectively; and
   control circuits and biasing circuits coupled to the array arranged to execute transition processes to read a data set with the sensing circuits in the first mode by sensing the first and second resistance states, and to change cells in the first resistance state to the third resistance state and to change cells in the second resistance state to the fourth resistance state so that the data set is readable with the sensing circuits in the second mode, to execute write processes to write data in the array by inducing the third and fourth resistance states in addressed cells, and to execute read processes to read data in the array with the sensing circuits in the second mode by sensing the third and fourth resistance states,
   wherein the control circuits and biasing circuits are arranged to induce the first resistance state by applying a current pulse having a first magnitude and first duration, and to induce the second resistance state by applying a current pulse having a second magnitude and a second duration, and wherein the first duration is greater than the second duration, and wherein the first and second magnitudes are less than a magnitude applied to induce an amorphous phase in an active region in a cell in the array, and the first magnitude is greater than the second magnitude.

2. The integrated circuit of claim 1, wherein the data set before the transition processes is represented by some memory cells in the array having the first resistance state and by other memory cells in the array having the second resistance state.

3. The integrated circuit of claim 1, wherein the array comprises memory elements comprising a phase change material having a basis stoichiometry, and the first resistance state is characterized by an active region in a cell having a stoichiometric combination with a lower crystalline phase resistance than a crystalline phase resistance of the phase change material with the basis stoichiometry.

4. The integrated circuit of claim 1, wherein the array includes basis phase change memory material comprising dielectric-doped $Ge_xSb_yTe_z$.

5. The integrated circuit of claim 4, wherein the control circuits and bias circuits are arranged to induce the first resistance state by applying a current pulse to cause a change in stoichiometry in an active region of the phase change material to stoichiometric combination having an increased concentration of antimony.

6. The integrated circuit of claim 1, wherein the first resistance state corresponds with a range of resistance having a maximum resistance less than minimum resistances of ranges of resistance corresponding to the third and fourth resistance states.

7. The integrated circuit of claim 1, wherein the third resistance state is characterized by an active region in a cell having an amorphous phase.

8. The integrated circuit of claim 1, wherein the third resistance state is characterized by an active region in a cell having an amorphous phase, and the fourth resistance state is characterized by an active region in a cell having a crystalline phase.

9. The integrated circuit of claim 1, wherein the control circuits and biasing circuits are arranged to induce the second resistance state including establishing a crystalline phase in an active region of corresponding cells, and to induce the third resistance state including establishing an amorphous phase in the active region of the corresponding cells.

* * * * *